US008547384B2

(12) United States Patent
Champion et al.

(10) Patent No.: US 8,547,384 B2
(45) **Date of Patent: *Oct. 1, 2013**

(54) CHECKERBOARD BUFFER

(75) Inventors: Mark Champion, Kenmore, WA (US); Brian Dockter, Edmonds, WA (US)

(73) Assignees: Sony Corporation, Tokyo (JP); Sony Electronics Inc., Park Ridge, NJ (US)

(*) Notice: Subject to any disclaimer, the term of this patent is extended or adjusted under 35 U.S.C. 154(b) by 2159 days.

This patent is subject to a terminal disclaimer.

(21) Appl. No.: 10/959,535

(22) Filed: Oct. 5, 2004

(65) Prior Publication Data

US 2005/0057572 A1 Mar. 17, 2005

Related U.S. Application Data

(63) Continuation of application No. 09/908,301, filed on Jul. 17, 2001, now Pat. No. 6,803,917, which is a continuation of application No. 09/908,295, filed on Jul. 17, 2001, now Pat. No. 6,831,651, application No. 10/959,535, which is a continuation of application No. 09/907,852, filed on Jul. 17, 2001, now Pat. No. 6,831,650, application No. 10/959,535, which is a continuation of application No. 09/907,854, filed on Jul. 17, 2001, now Pat. No. 6,801,204.

(60) Provisional application No. 60/269,784, filed on Feb. 15, 2001, provisional application No. 60/269,783, filed on Feb. 15, 2001.

(51) Int. Cl.

| | |
|---|---|
| ***G09G 5/39*** | (2006.01) |
| ***G09G 5/399*** | (2006.01) |
| ***G09G 5/36*** | (2006.01) |
| ***G06F 13/00*** | (2006.01) |

(52) U.S. Cl.

USPC ........... 345/540; 345/531; 345/536; 345/539; 345/545

(58) Field of Classification Search

USPC .................. 340/744; 345/55, 530, 539, 540, 345/541, 629, 659, 531, 536, 545; 355/335; 358/140; 364/200; 382/128; 395/405; 711/5

See application file for complete search history.

(56) References Cited

U.S. PATENT DOCUMENTS 4,189,767 A 2/1980 Ahuja
4,449,199 A 5/1984 Daigle (Continued)

OTHER PUBLICATIONS

SMPTE Standard for Television 1920×1080 Scanning and Parallel Digital Interfaces for Multiple Picture Rates SMPTE 274-1998; Copyright 1998; pp. 1-24; Revision of ANSI/SMPTE 274M-1995; The Society of Motion Picture and Television Engineers; White Plains, New York.

(Continued)

*Primary Examiner* — Jeffrey Chow

(74) *Attorney, Agent, or Firm* — Fitch, Even, Tabin & Flannery LLP

(57) ABSTRACT

Methods and apparatus for storing and retrieving data in parallel but in different orders. In one implementation, data for pixels is stored according to a checkerboard pattern, alternately between two memory devices, forming a checkerboard buffer. In one implementation, a checkerboard buffer includes: a data source, providing data in a first order; a data destination, receiving data in a second order; at least two memory devices, each memory device having a plurality of memory locations, where data is stored in parallel to the memory devices and retrieved in parallel from the memory devices; a first data switch connected to the data source and each of the memory devices, where the first data switch controls which data is stored to which memory device; and a second data switch connected to the data destination and each of the memory devices, where the second data switch controls providing data to the data destination according to the second order.

82 Claims, 23 Drawing Sheets

(56) References Cited

U.S. PATENT DOCUMENTS

| | | | | |
|---|---|---|---|---|
| 4,603,350 | A * | 7/1986 | Arbeiter et al. | 348/448 |
| 4,744,046 | A | 5/1988 | Foster | |
| 4,811,210 | A * | 3/1989 | McAulay | 710/317 |
| 4,890,165 | A * | 12/1989 | Hasegawa | 348/312 |
| 5,117,289 | A * | 5/1992 | Farley et al. | 348/443 |
| 5,136,394 | A * | 8/1992 | Haikawa et al. | 386/69 |
| 5,138,705 | A | 8/1992 | Lo et al. | |
| 5,142,276 | A | 8/1992 | Moffat | |
| 5,195,182 | A | 3/1993 | Sasson | |
| 5,210,614 | A | 5/1993 | Kannegundla et al. | |
| 5,268,682 | A | 12/1993 | Yang et al. | |
| 5,303,341 | A | 4/1994 | Rivshim | |
| 5,479,605 | A | 12/1995 | Saitoh | |
| 5,559,953 | A | 9/1996 | Seiler et al. | |
| 5,561,777 | A * | 10/1996 | Kao et al. | 711/5 |
| 5,579,473 | A | 11/1996 | Schlapp et al. | |
| 5,587,742 | A | 12/1996 | Hau et al. | |
| 5,606,650 | A | 2/1997 | Kelley et al. | |
| 5,619,471 | A | 4/1997 | Nunziata | |
| 5,629,719 | A | 5/1997 | Cahill, III | |
| 5,633,726 | A | 5/1997 | Timmermans | |
| 5,668,568 | A | 9/1997 | Holloman | |
| 5,781,201 | A | 7/1998 | McCormack et al. | |
| 5,794,016 | A | 8/1998 | Kelleher | |
| 5,798,843 | A | 8/1998 | Yamamoto et al. | |
| 5,815,167 | A | 9/1998 | Muthal et al. | |
| 5,815,169 | A | 9/1998 | Oda | |
| 5,831,926 | A | 11/1998 | Norris et al. | |
| 5,835,952 | A | 11/1998 | Yamauchi | |
| 5,912,676 | A | 6/1999 | Malladi | |
| 5,924,111 | A | 7/1999 | Huang et al. | |
| 5,933,154 | A | 8/1999 | Howard et al. | |
| 6,002,810 | A | 12/1999 | Wakisawa et al. | |
| 6,005,592 | A | 12/1999 | Koizumi et al. | |
| 6,018,354 | A | 1/2000 | Jones et al. | |
| 6,023,745 | A | 2/2000 | Lu | |
| 6,031,638 | A | 2/2000 | Rao et al. | |
| 6,105,114 | A | 8/2000 | Okuno | |
| 6,111,992 | A | 8/2000 | Likhterov et al. | |
| 6,150,679 | A | 11/2000 | Reynolds | |
| 6,157,396 | A | 12/2000 | Margulis et al. | |
| 6,177,922 | B1 | 1/2001 | Schiefer et al. | |
| 6,226,709 | B1 | 5/2001 | Goodwin et al. | |
| 6,259,459 | B1 | 7/2001 | Middleton | |
| 6,278,645 | B1 | 8/2001 | Bukelew et al. | |
| 6,281,873 | B1 | 8/2001 | Oakley | |
| 6,282,603 | B1 | 8/2001 | Rao | |
| 6,301,649 | B1 | 10/2001 | Takasugi | |
| 6,331,854 | B1 | 12/2001 | Rogers et al. | |
| 6,340,994 | B1 | 1/2002 | Margulis et al. | |
| 6,347,344 | B1 | 2/2002 | Baker et al. | |
| 6,349,143 | B1 * | 2/2002 | Hastings et al. | 382/128 |
| 6,367,933 | B1 | 4/2002 | Chen et al. | |
| 6,417,848 | B1 | 7/2002 | Battle | |
| 6,417,867 | B1 | 7/2002 | Hallberg | |
| 6,456,339 | B1 | 9/2002 | Surati et al. | |
| 6,456,340 | B1 | 9/2002 | Margulis | |
| 6,473,193 | B1 | 10/2002 | Itoh | |
| 6,480,428 | B2 | 11/2002 | Zheng | |
| 6,496,192 | B1 | 12/2002 | Shreesha et al. | |
| 6,519,673 | B1 | 2/2003 | Chudnovsky et al. | |
| 6,549,207 | B1 | 4/2003 | Matsumoto | |
| 6,567,531 | B1 | 5/2003 | Kondo et al. | |
| 6,587,112 | B1 | 7/2003 | Goeltzenleuchter et al. | |
| 6,614,441 | B1 * | 9/2003 | Jiang et al. | 345/539 |
| 6,650,332 | B2 | 11/2003 | Doyle et al. | |
| 6,665,749 | B1 | 12/2003 | Ansari | |
| 6,674,484 | B1 | 1/2004 | Boland et al. | |
| 6,724,396 | B1 | 4/2004 | Emmot et al. | |
| 6,724,948 | B1 | 4/2004 | Lippincott | |
| 6,744,533 | B1 | 6/2004 | Easwar et al. | |
| 6,765,579 | B2 | 7/2004 | Champion | |
| 6,765,580 | B2 | 7/2004 | Champion | |
| 6,768,490 | B2 | 7/2004 | Champion | |
| 6,791,557 | B2 | 9/2004 | Champion | |
| 6,795,079 | B2 | 9/2004 | Champion | |
| 6,801,204 | B2 | 10/2004 | Champion et al. | |
| 6,803,917 | B2 | 10/2004 | Champion et al. | |
| 6,819,334 | B1 * | 11/2004 | Owada et al. | 345/659 |
| 6,828,977 | B2 | 12/2004 | Champion | |
| 6,831,649 | B2 | 12/2004 | Champion | |
| 6,831,650 | B2 | 12/2004 | Champion et al. | |
| 6,831,651 | B2 | 12/2004 | Champion et al. | |
| 6,850,241 | B2 | 2/2005 | Champion | |
| 6,871,001 | B1 | 3/2005 | Okada | |
| 6,917,363 | B2 | 7/2005 | Candler et al. | |
| 6,965,980 | B2 | 11/2005 | Champion | |
| 6,992,674 | B2 | 1/2006 | Champion et al. | |
| 7,038,691 | B2 | 5/2006 | Champion | |
| 7,046,249 | B2 | 5/2006 | Champion | |
| 7,068,281 | B2 | 6/2006 | Champion | |
| 7,088,369 | B2 | 8/2006 | Champion | |
| 7,129,953 | B2 | 10/2006 | Champion | |
| 7,205,993 | B2 | 4/2007 | Champion | |
| 7,573,483 | B2 | 8/2009 | Champion | |
| 2002/0050959 | A1 * | 5/2002 | Buckelew et al. | 345/55 |
| 2002/0109689 | A1 | 8/2002 | Champion et al. | |
| 2002/0109690 | A1 | 8/2002 | Champion et al. | |
| 2002/0109691 | A1 | 8/2002 | Champion et al. | |
| 2002/0109692 | A1 | 8/2002 | Champion et al. | |
| 2002/0109693 | A1 | 8/2002 | Champion et al. | |
| 2002/0109694 | A1 | 8/2002 | Champion et al. | |
| 2002/0109695 | A1 | 8/2002 | Champion et al. | |
| 2002/0109696 | A1 | 8/2002 | Champion et al. | |
| 2002/0109698 | A1 | 8/2002 | Champion et al. | |
| 2002/0109699 | A1 | 8/2002 | Champion | |
| 2002/0109791 | A1 | 8/2002 | Champion | |
| 2002/0109792 | A1 | 8/2002 | Champion | |
| 2002/0110030 | A1 | 8/2002 | Champion | |
| 2002/0110351 | A1 | 8/2002 | Champion et al. | |
| 2002/0113904 | A1 | 8/2002 | Champion | |
| 2002/0130876 | A1 | 9/2002 | Champion | |
| 2002/0149596 | A1 | 10/2002 | Champion | |
| 2003/0058368 | A1 | 3/2003 | Champion | |
| 2003/0151609 | A1 | 8/2003 | Champion | |
| 2004/0233206 | A1 | 11/2004 | Champion | |
| 2004/0246258 | A1 | 12/2004 | Champion | |
| 2005/0024368 | A1 | 2/2005 | Champion | |
| 2005/0057572 | A1 | 3/2005 | Champion | |
| 2005/0104890 | A1 | 5/2005 | Champion | |
| 2008/0049032 | A1 | 2/2008 | Champion | |

OTHER PUBLICATIONS

Bloom, DM; "The Grating Light Valve: revolutionizing display technology;" pp. 1-10; Silicon Light Machines (formerly Echelle, Inc).

Corrigan, R.W. et al; "An Alternative Architecture for High Performance Display;" Presented at the 141st SMPTE Technical Conference and Exhibition; Nov. 20, 1999, New York , New York pp. 1-5, Silicon Machines, Sunnyvale, California.

Hearn, D. et al; Computer Graphics C Version [2nd Ed] pp. 53-56; Prentice Hall, Upper Saddle River, New Jersey.

McCarron, D. et al; "Accelerating PC Graphics; Emerging Technologies Edition," Market Strategy and Forecase Report; 1995, pp. 2-49 through 2-93, 2-159 (labeled as pp. 1-46); Mercury Research.

Lieberman, David; "Sony champions MEMS display technology;" EE Times, Jul. 14, 2000; http://www.eetimes.com/story/OEG20000714S0004.

US Patent & Trademark Office, Notice of Allowance from U.S. Appl. No. 10/924,495 dated Apr. 20, 2006.

US Patent & Trademark Office, Office Action from U.S. Appl. No. 10/924,495 dated Oct. 20, 2005.

US Patent & Trademark Office, Office Action from U.S. Appl. No. 10/924,495 dated Apr. 14, 2005.

US Patent & Trademark Office, Notice of Allowance from U.S. Appl. No. 10/051,538 dated Mar. 19, 2004.

US Patent & Trademark Office, Office Action from U.S. Appl. No. 10/051,538 dated Nov. 26, 2003.

US Patent & Trademark Office, Notice of Allowance from U.S. Appl. No. 10/052,074 dated Apr. 5, 2004.

US Patent & Trademark Office, Office Action from U.S. Appl. No. 10/052,074 dated Jan. 21, 2004.

US Patent & Trademark Office, Notice of Allowance from U.S. Appl. No. 10/869,781 dated May 10, 2005.
US Patent & Trademark Office, Office Action from U.S. Appl. No. 10/869,781 dated Oct. 6, 2004.
US Patent & Trademark Office, Office Action from U.S. Appl. No. 10/869,781 dated May 10, 2005.
US Patent & Trademark Office, Office Action from U.S. Appl. No. 10/075,775 dated Oct. 23, 2003.
US Patent & Trademark Office, Notice of Allowance from U.S. Appl. No. 10/075,775 dated Apr. 14, 2004.
US Patent & Trademark Office, Notice of Allowance from U.S. Appl. No. 10/075,775 dated Oct. 26, 2004.
US Patent & Trademark Office, Notice of Allowance from U.S. Appl. No. 10/075,775 dated Aug. 30, 2004.
US Patent & Trademark Office, Supplemental Notice of Allowance from U.S. Appl. No. 10/075,775 dated Oct. 26, 2004.
US Patent & Trademark Office, Notice of Allowance from U.S. Appl. No. 10/882,490 dated Apr. 22, 2005.
US Patent & Trademark Office, Office Action from U.S. Appl. No. 10/882,490 dated Nov. 16, 2004.
US Patent & Trademark Office, Office Action from U.S. Appl. No. 10/076,965 dated Dec. 10, 2003.
US Patent & Trademark Office, Notice of Allowance from U.S. Appl. No. 10/075,965 dated Mar. 18, 2004.
US Patent & Trademark Office, Office Action from U.S. Appl. No. 10/077,131 dated Nov. 17, 2003.
US Patent & Trademark Office, Notice of Allowance from U.S. Appl. No. 10/077,131 dated Mar. 30, 2004.
US Patent & Trademark Office, Notice of Allowance from U.S. Appl. No. 10/077,131 dated Oct. 26, 2004.
US Patent & Trademark Office, Notice of Allowance from U.S. Appl. No. 10/075,678 dated Mar. 5, 2004.
US Patent & Trademark Office, Office Action from U.S. Appl. No. 10/075,678 dated Nov. 5, 2003.
US Patent & Trademark Office, Office Action from U.S. Appl. No. 11/007,086 dated Aug. 14, 2007.
US Patent & Trademark Office, Office Action from U.S. Appl. No. 11/007,086 dated Apr. 25, 2007.
US Patent & Trademark Office, Office Action from U.S. Appl. No. 11/007,086 dated Nov. 15, 2006.
US Patent & Trademark Office, Notice of Allowance from U.S. Appl. No. 10/076,685 dated Jan. 25, 2008.
US Patent & Trademark Office, Notice of Allowance from U.S. Appl. No. 10/077,736 dated Dec. 2, 2004.
US Patent & Trademark Office, Office Action for U.S. Appl. No. 10/077,736 dated May 25, 2004.
US Patent & Trademark Office, Office Action from U.S. Appl. No. 11/007,086 dated Feb. 14, 2008.
US Patent & Trademark Office, Office Action from U.S. Appl. No. 10/107,118 dated Feb. 25, 2005.
US Patent & Trademark Office, Office Action from U.S. Appl. No. 10/107,118 dated Aug. 12, 2005.
US Patent & Trademark Office, Office Action from U.S. Appl. No. 10/107,118 dated Dec. 1, 2005.
US Patent & Trademark Office, Office Action from U.S. Appl. No. 10/107,118 dated Jun. 2, 2006.
US Patent & Trademark Office, Office Action from U.S. Appl. No. 10/107,118 dated Jan. 12, 2007.
US Patent & Trademark Office, Office Action from U.S. Appl. No. 10/107,118 dated Nov. 4, 2005.
US Patent & Trademark Office, Office Action from U.S. Appl. No. 10/076,685 dated Mar. 10, 2005.
US Patent & Trademark Office, Office Action from U.S. Appl. No. 10/076,685 dated Aug. 7, 2006.
US Patent & Trademark Office, Office Action from U.S. Appl. No. 10/076,685 dated Mar. 7, 2007.
US Patent & Trademark Office, Notice of Allowance from U.S. Appl. No. 10/076,685 dated Aug. 10, 2007.
US Patent & Trademark Office, Office Action from U.S. Appl. No. 09/908,295 dated Aug. 25, 2003.
US Patent & Trademark Office, Notice of Allowance from U.S. Appl. No. 09/908,295 dated May 29, 2004.
US Patent & Trademark Office, Notice of Allowance from U.S. Appl. No. 09/907,852 dated May 29, 2004.
US Patent & Trademark Office, Office Action from U.S. Appl. No. 09/907,852 dated Aug. 21, 2003.
US Patent & Trademark Office, Notice of Allowance from U.S. Appl. No. 09/907,854 dated Mar. 22, 2004.
US Patent & Trademark Office, Office Action from U.S. Appl. No. 09/907,854 dated Sep. 8, 2003.
US Patent & Trademark Office, Notice of Allowance from U.S. Appl. No. 09/908,301 dated Mar. 9, 2004.
US Patent & Trademark Office, Office Action from U.S. Appl. No. 09/908,301 dated Sep. 18, 2003.
US Patent & Trademark Office, Office Action from U.S. Appl. No. 10/051,680 dated Apr. 2, 2004.
US Patent & Trademark Office, Office Action from U.S. Appl. No. 10/051,680 dated Oct. 23, 2003.
US Patent & Trademark Office, Notice of Allowance from U.S. Appl. No. 10/051,680 dated Jul. 27, 2004.
US Patent & Trademark Office, Notice of Allowance from U.S. Appl. No. 10/051,541 dated Dec. 5, 2005.
US Patent & Trademark Office, Notice of Allowance from U.S. Appl. No. 10/051,541 dated Oct. 6, 2005.
US Patent & Trademark Office, Notice of Allowance from U.S. Appl. No. 10/051,451 dated Feb. 9, 2004.
US Patent & Trademark Office, Office Action from U.S. Appl. No. 10/051,451 dated Nov. 5, 2003.
US Patent & Trademark Office, Notice of Allowance from U.S. Appl. No. 10/076,942 dated Jun. 15, 2005.
US Patent & Trademark Office, Office Action from U.S. Appl. No. 10/076,942 dated Oct. 5, 2004.
US Patent & Trademark Office, Notice of Allowance from U.S. Appl. No. 10/076,832 dated Jun. 6, 2005.
US Patent & Trademark Office, Office Action from U.S. Appl. No. 10/076,832 dated Sep. 28, 2004.
US Patent & Trademark Office, Notice of Allowance from U.S. Appl. No. 10/076,943 dated Oct. 6, 2005.
US Patent & Trademark Office, Office Action from U.S. Appl. No. 10/076,943 dated Oct. 5, 2004.
US Patent & Trademark Office, Office Action from U.S. Appl. No. 10/076,943 dated Jun. 23, 2005.
US Patent & Trademark Office, Office Action from U.S. Appl. No. 10/077,636 dated Nov. 12, 2003.
US Patent & Trademark Office, Notice of Allowance from U.S. Appl. No. 10/077,636 dated Mar. 5, 2004.
Champion, et al., U.S. Appl. No. 09/907,854, filed Jul. 17, 2001.
Champion, et al., U.S. Appl. No. 09/908,295, filed Jul. 17, 2001.
Champion, et al., U.S. Appl. No. 09/908,301, filed Jul. 17, 2001.
Champion, et al., U.S. Appl. No. 10/051,538, filed Jan. 16, 2002.
Champion, et al., U.S. Appl. No. 10/051,541, filed Jan. 16, 2002.
Champion, et al., U.S. Appl. No. 10/051,680, filed Jan. 16, 2002.
Champion, et al., U.S. Appl. No. 10/052,074, filed Jan. 16, 2002.
Champion, et al., U.S. Appl. No. 10/076,685, filed Feb. 14, 2002.
Champion, et al., U.S. Appl. No. 10/076,832, filed Feb. 14, 2002.
Champion, et al., U.S. Appl. No. 10/076,942, filed Feb. 14, 2002.
Champion, et al., U.S. Appl. No. 10/076,943, filed Feb. 14, 2002.
Champion, et al., U.S. Appl. No. 11/932,217, Itself.
US Patent & Trademark Office, et al., Office Action from U.S. Appl. No. 11/007,086 mailed Jul. 31, 2008.
Final Office Action from U.S. Appl. No. 11/007,086 mailed Jan. 12, 2009.
Examiner Interview Summary from U.S. Appl. No. 11/007,086 mailed Apr. 3, 2009.
Notice of Allowance from U.S. Appl. No. 11/007,086 mailed Apr. 8, 2009.
Non Final Office Action from U.S. Appl. No. 11/932,217 mailed Jun. 25, 2009.
Champion, U.S. Appl. No. 11/007,086, filed Dec. 7, 2004.
Champion, U.S. Appl. No. 60/269,783, filed Feb. 15, 2001.
Champion, U.S. Appl. No. 60/269,784, filed Feb. 15, 2001.
Champion, U.S. Appl. No. 60/324,498, filed Sep. 24, 2001.

* cited by examiner

305

310

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |

| 0 | 2 | 4 | 6 |
|---|---|---|---|
| 8 | 10 | 12 | 14 |
| 16 | 18 | 20 | 22 |
| 24 | 26 | 28 | 30 |

| 1 | 3 | 5 | 7 |
|---|---|---|---|
| 9 | 11 | 13 | 15 |
| 17 | 19 | 21 | 23 |
| 25 | 27 | 29 | 31 |

| ADDRESS | FIRST MEMORY | SECOND MEMORY |
|---|---|---|
| 0 | 0 | 1 |
| 1 | 2 | 3 |
| ... | ... | ... |
| 959 | 1918 | 1919 |
| 960 | UNUSED | UNUSED |
| ... | ... | ... |
| 1023 | UNUSED | UNUSED |
| 1024 | 1921 | 1920 |
| 1025 | 1923 | 1922 |
| ... | ... | ... |
| 2048 | 3840 | 3841 |
| 2049 | 3842 | 3843 |
| ... | ... | ... |
| 3072 | 5761 | 5760 |
| 3073 | 5763 | 5762 |
| ... | ... | ... |

| ADDRESS | FIRST MEMORY | SECOND MEMORY |
| --- | --- | --- |
| 0 | 0 | 1 |
| 1 | 2 | 3 |
| ... | ... | ... |
| 959 | 1918 | 1919 |
| 960 | 1921 | 1920 |
| 961 | 1923 | 1922 |
| ... | ... | ... |
| 1920 | 3840 | 3841 |
| 1921 | 3842 | 3843 |
| ... | ... | ... |
| 2880 | 5761 | 5760 |
| 2881 | 5763 | 5762 |
| ... | ... | ... |

CHECKERBOARD BUFFER

RELATED APPLICATIONS

This application is a continuation of U.S. patent application Ser. No. 09/908,301, filed Jul. 17, 2001, entitled CHECKERBOARD BUFFER USING MEMORY BANK ALTERNATION, to Champion et al., which claims the benefit of U.S. Provisional Application No. 60/269,784 filed Feb. 15, 2001, and claims the benefit of U.S. Provisional Application No. 60/269,783 filed Feb. 15, 2001, the disclosures of which are all incorporated herein by reference in their entirety.

This application is a continuation of U.S. patent application Ser. No. 09/908,295, filed Jul. 17, 2001, entitled CHECKERBOARD BUFFER, to Champion et al., which claims the benefit of U.S. Provisional Application No. 60/269,784 filed Feb. 15, 2001, and claims the benefit of U.S. Provisional Application No. 60/269,783 filed Feb. 15, 2001, the disclosures of which are all incorporated herein by reference in their entirety.

This application is a continuation of U.S. patent application Ser. No. 09/907,852, filed Jul. 17, 2001, entitled CHECKERBOARD BUFFER USING SEQUENTIAL MEMORY LOCATIONS, to Champion et al., which claims the benefit of U.S. Provisional Application No. 60/269,784 filed Feb. 15, 2001, and claims the benefit of U.S. Provisional Application No. 60/269,783 filed Feb. 15, 2001, the disclosures of which are all incorporated herein by reference.

This application is a continuation of U.S. patent application Ser. No. 09/907,854, filed Jul. 17, 2001, entitled CHECKERBOARD BUFFER USING MEMORY BLOCKS, to Champion et al., which claims the benefit of U.S. Provisional Application No. 60/269,784 filed Feb. 15, 2001, and claims the benefit of U.S. Provisional Application No. 60/269,783 filed Feb. 15, 2001, the disclosures of which are all incorporated herein by reference in their entirety.

BACKGROUND

The present invention is related to video data storage. More particularly, the present invention is related to video display systems and frame buffers. Several related technologies are discussed below (in labeled sections for clarity).

1. Raster-Scan Displays

A common type of graphics monitor is a conventional raster-scan display using a cathode ray tube ("CRT"). As is well known, in a typical CRT, an electron beam strikes phosphor on the inner surface of the screen producing light visible on the outer surface of the screen. By controlling the electron beam different locations of the screen can be struck, creating a pattern and hence a video image. In a typical CRT raster-scan display, the screen area is divided into a grid of pixels (or picture elements). The electron beam sweeps from left to right across the screen, one row at a time from top to bottom, progressively drawing each pixel on the screen. Each row of pixels is commonly referred to as a scan line. In this type of conventional display, the scan lines are horizontal. The number of pixels in a single scan line is referred to as the width. One complete pass over the screen and the pixels in that pass are commonly referred to as a frame. As the electron beam moves across the pixels of each scan line, the beam intensity can be adjusted to vary the light produced by the screen phosphor corresponding to the pixels. The light emitted by the phosphor of the pixels creates a pattern of illuminated spots forming the video image. The intensity of the electron beam is controlled by image data stored in a section of memory called the frame buffer or refresh buffer.

2. Grating Light Valves

Another type of display system uses one or more grating light valves ("GLV") to produce an image. GLV's are known devices, and a description can be found in (among other sources) a paper by D. M. Bloom of Silicon Light Machines, Inc., titled "The Grating Light Valve: revolutionizing display technology" (1997; available from Silicon Light Machines; and a copy of which has been filed in an Information Disclosure Statement for this application), and in an article (and therein cited references) by R. W. Corrigan and others of Silicon Light Machines, Inc., titled "An Alternative Architecture for High Performance Display" (presented at the 141$^{st}$ SMPTE Technical Conference and Exhibition, Nov. 20, 1999, in New York, N. Y.), the disclosures of which are incorporated herein by reference. In overview, a GLV uses a combination of reflection and diffraction of light to create an image. A GLV includes a one-dimensional array of GLV pixels, each GLV pixel including a number of microscopic "ribbons." The ribbons for each GLV pixel can be deflected through electrostatic force to create an adjustable diffraction grating. In a non-deflected state, the ribbons reflect light. As the ribbons are deflected, the ribbons increasingly diffract light. Accordingly, by controlling the ribbons, the proportion of light that is either reflected or diffracted can be controlled for each GLV pixel. The GLV deflects the ribbons for each GLV pixel according to image data, such as pixel data received from a frame buffer.

An array of GLV pixels can create a column of visible pixels, such as 1088 pixels, typically an entire column at a time. A GLV can be used to create a vertical column of pixels in a high definition resolution image, such as a screen resolution of 1920 pixels horizontally by 1080 pixels vertically (with some of the 1088 pixels left blank or dark). By providing a GLV with pixel data representing columns of pixels in a frame, the GLV can create the frame of pixels, one column at a time, sweeping from left to right. The location of each column of pixels can be controlled external to the GLV array, such as through lenses and an adjustable mirror, rather than moving the GLV itself. A combination of three GLV's for red, green, and blue can be used to produce a color image.

3. Frame Buffers

FIG. 1A is a representation of a screen 105 as a grid of pixels 110. In FIG. 1A, for simplicity, screen 105 is only 4×4 and so only 16 pixels are shown, but a typical screen has many more pixels. One common screen resolution is high definition ("HD") resolution, where screen resolution indicates the number of pixels in a frame and is typically given as the horizontal resolution (number of pixels in one row) versus the vertical resolution (number of pixels in one column). HD resolution is either 1920×1080 (2,073,600 total pixels per frame) or 1280×720 (921,600 pixels per frame). Herein, HD resolution refers to 1920×1080.

Returning to FIG. 1A, the pixels 110 are often numbered sequentially for reference. Pixel 0 is typically at the upper left. FIG. 1B is a representation of a memory device 150 implementing a frame buffer as a grid of memory locations 155. Typical memory devices include SDRAM (synchronous dynamic random access memory). The actual memory device used may vary in different devices, but the memory locations for the frame buffer are typically in a contiguous block of locations with sequential addresses. Memory device 150 has a memory location 155 for storing pixel data (e.g., an intensity value) for each pixel 110 of screen 105. In some implementations, pixel data for more than one pixel is stored at each memory location. In many conventional raster-scan systems, pixel data is stored in memory locations adjacent to one another in the same pattern as the pixels on the screen. In FIG. 1B, each memory location 155 is numbered with the number of the pixel (110 from FIG. 1A) corresponding to the pixel data stored in that memory location 155. For example, the pixel at the upper left of the screen is pixel 0 in FIG. 1A and pixel data for pixel 0 is stored in the first memory location in memory device 150, as indicated by the "0" in the upper left memory location 155. The second memory location stores pixel data for pixel 1, the fifth memory location stores pixel data for pixel 4, and so on.

4. Pixel Rates

FIG. 2 is a representation of screen resolutions and typical data throughput requirements. FIG. 2 shows four resolutions in respective areas: VGA resolution (640×480) 205, XGA resolution (1024×768) 210, SXGA resolution (1280×1024) 215, and HD resolution (1920×1080) 220. The pixel rate for a screen resolution is the number of pixels per second that need to be processed to maintain the screen resolution at a specified refresh rate (i.e., the number of times a complete frame is drawn to the screen per second). While pixel rates vary among implementations, the pixel rates shown in FIG. 2 are representative. These pixel rates are given in megapixels per second ("MP/S"). For example, according to SMPTE 274M-1998 (a specification defining, among other things, pixel rates for resolutions of 1920×1080), for HD resolution 220 the pixel rate is about 150 MP/S @ 60 Hz. FIG. 2 also shows a corresponding approximate data rate in megabytes per second ("MB/S") for each resolution. The data rate is the number of bytes per second to be processed based on the number of bytes per pixel and the pixel rate. For example, HD resolution 220 has a data rate of 450 MB/S, at 24 bits per pixel (3 bytes). If each pixel has 32 bits of data, the data rate for HD resolution is 600 MB/S. However, the data rate of a typical 32-bit wide SDRAM running at 125 MHZ is approximately 500 MB/S. A frame buffer architecture using two 125 MHZ SDRAM's can realize a data rate of approximately 1000 MB/S.

5. Frame Buffers Using Parallel Storage in Two Memory Devices

FIG. 3A is a representation of a frame 305 of pixels 310 divided between two memory devices. Frame 305 has only 32 pixels for simplicity, but, as noted above, a typical HD resolution frame has 2,073,600 pixels. FIG. 3B is a representation of a first memory device 350 and FIG. 3C is a representation of a second memory device 375. Each pixel 310 in frame 305 is numbered, starting with pixel 0 in the upper left of frame 305. Even-numbered pixels are stored in first memory device 350 and odd-numbered pixels are stored in second memory device 375. The pixels stored in second memory device 375 are also shaded for clarity in FIGS. 3A and 3C.

FIG. 4 is a block diagram of a typical frame buffer architecture 400 capable of accessing pixel data for two pixels in parallel, supporting the representations shown in FIGS. 3A, 3B, and 3C. A video source 405 provides pixel data to a first memory 410 (recall first memory device 350 in FIG. 3B) and to a second memory 415 (recall second memory device 375 in FIG. 3C) in parallel and a video destination 420 retrieves pixel data from first memory 410 and from second memory 415 in parallel. In this implementation, pixel data for each pixel is stored in a separate addressable memory location. Video source 405 receives video data from another source (not shown), such as a broadcast source or a software application running on a computer system connected to video source 405. Video destination 420 controls the display of each pixel on a video device (not shown), such as a CRT. First memory 410 and second memory 415 are separate memory devices such as two SDRAM's. A first data bus 425 is connected to video source 405, first memory 410, and video destination 420. A second data bus 430 is connected to video source 405, second memory 415, and video destination 420. A source address bus 435 is connected to video source 405 and a first input 440 of an address multiplexor 445. A destination address bus 450 is connected to video destination 420 and a second input 455 of address multiplexor 445. An output 460 of address multiplexor 445 is connected to first memory 410 and second memory 415. Accordingly, the same address is provided to both first memory 410 and second memory 415. Address multiplexor 445 receives a control signal (not shown) to cause first input 440 or second input 455 to connect to output 460. First memory 410 and second memory 415 also receive control signals (not shown) to control whether memories 410 and 415 will read in data (write mode) or read out data (read mode). In addition, while clock lines are not shown in FIG. 4, architecture 400 operates based on clock cycles so that pixel data can be processed for two pixels per clock cycle in support of the desired pixel rate.

In operation, memories 410 and 415 read in or store complementary halves of a frame of pixels as pixel data from video source 405 and output the pixel data to video destination 420. To store pixel data, memories 410 and 415 are put in write mode and address multiplexor 445 is set to connect first input 440 to output 460. Video source 405 provides pixel data for a first pixel to first data bus 425, such as pixel 0 in FIG. 3A, and pixel data for a second pixel to second data bus 430, such as pixel 1 in FIG. 3A. First data bus 425 provides its pixel data to first memory 410 and second data bus 430 provides its pixel data to second memory 415. Video source 405 also provides an address to source address bus 435. To calculate the address, video source 405 can use a counter. Because each memory 410 and 415 stores pixel data for half the pixels in one frame, the counter typically ranges from 0 to one less than one-half of the number of pixels in one frame. Video source 405 can increment the counter by 1 for each pixel pair. Source address bus 435 provides the address to first input 440 of address multiplexor 445. Address multiplexor 445 in turn provides the address to first memory 410 and second memory 415. First memory 410 stores the pixel data on first data bus 425 at the address supplied by address multiplexor 445 from video source 405. Second memory 415 stores the pixel data on second data bus 430 at the same address. Two pixels have been stored in parallel in two memories using the same address. Referring to FIGS. 3A, 3B, and 3C, pixel 0 and pixel 1 are stored at the same time at the same address in first memory device 350 and second memory device 375, respectively. Accordingly, for example, pixel 0 is at address 0 in first memory device 350, pixel 1 is at address 0 in second memory device 375, pixel 2 is at address 1 in first memory device 350, pixel 3 is at address 1 in second memory device 375, and so on.

To retrieve pixel data, memories 410 and 415 are put in read mode and address multiplexor 445 is set to connect second input 455 to output 460. Video destination 420 provides an address to destination address bus 450. Destination address bus 450 provides the address to second input 455 of address multiplexor 445. Address multiplexor 445 in turn provides the address to first memory 410 and second memory 415. First memory 410 provides the pixel data stored at the address supplied by address multiplexor 445 from video destination 415 to first data bus 425. Second memory 415 provides the pixel data stored at the same address to second data bus 430. First data bus 425 provides its pixel data to video destination 420 and second data bus 430 provides its pixel data to video destination 420. Two pixels have been retrieved in parallel from two memories using the same address. Referring to FIGS. 3A, 3B, and 3C, pixel 0 and pixel 1 can be retrieved at the same time using the same address from first memory device 350 and second memory device 375, respectively.

FIG. 5 is a block diagram of another implementation of a dual pixel frame buffer architecture 500. Architecture 500 is similar to architecture 400 of FIG. 4, but a memory controller 545 provides data and addresses to memories 510 and 515. Memory controller 545 receives pixel data from video source 505 to store in memories 510 and 515. Memory controller 545 retrieves pixel data from memories 510 and 515 and provides the pixel data to video destination 520. Memory controller 545 replaces address multiplexor 445. Memory controller 545 receives signals from video source 505 and video destination 520 indicating whether pixel data is to be stored to or retrieved from memories 510 and 515. Memory controller 545 generates addresses and supplies these addresses along with control signals to memories 510 and 515. Accordingly, memory controller 545 controls address generation rather than video source 505 and video destination 520, as compared with architecture 400 of FIG. 4. In addition, as noted above with respect to FIG. 4, architecture 500 operates based on clock cycles so that pixel data can be processed for two pixels per clock cycle in support of the desired pixel rate.

6. Double-Buffering

Typical frame buffer architectures often also utilize "double-buffering." Double-buffering is a well known technique where the memory address space of a frame buffer is divided into two sections. In some architectures, each section is a separate memory device, and in other architectures one or more devices are each divided into sections. Data from a frame is stored in one section while data from a previously stored frame is read from the other section. Series of reading and writing operations alternate. For example, after storing pixel data for 16 pixels, pixel data for 16 pixels is retrieved. After storing a frame, the sections switch roles. Pixel data for blocks of pixels can be temporarily stored before being sent to memory or after being received from memory in a buffer, such as a FIFO buffer. In architectures 400 and 500 from FIGS. 4 and 5, respectively, FIFO buffers can be included in both the video source and the video destination, or in the memory controller.

SUMMARY

The present invention provides methods and apparatus for storing and retrieving data in parallel but in different orders. In one implementation, data for pixels is stored according to a checkerboard pattern, alternately between two memory devices, forming a checkerboard buffer. In one implementation, a checkerboard buffer includes: a data source, providing data in a first order; a data destination, receiving data in a second order; at least two memory devices, each memory device having a plurality of memory locations, where data is stored in parallel to the memory devices and retrieved in parallel from the memory devices; a first data switch connected to the data source and each of the memory devices, where the first data switch controls which data is stored to which memory device; and a second data switch connected to the data destination and each of the memory devices, where the second data switch controls providing data to the data destination according to the second order.

In another implementation, a checkerboard buffer includes: a video source providing pixel data for pixels in a frame; a video destination; a first memory; a second memory; a first data bus connected to the first memory; a second data bus connected to the second memory; a first address multiplexor connected to the first memory; a second address multiplexor connected to the second memory; a source address bus connected to the video source, the first address multiplexor, and the second address multiplexor; a first destination address bus connected to the video destination and the first address multiplexor; a second destination address bus connected to the video destination and the second address multiplexor; a first data switch connected to the first data bus, the second data bus, and the video source, where the first data switch is between the video source and the first memory and between the video source and the second memory, and where the first data switch switches which memory to store pixel data for two pixels with each horizontal row of pixels; and a second data switch connected to the first data bus, the second data bus, and the video destination, where the second data switch is between the video destination and the first memory and between the video destination and the second memory, and where the second data switch switches the order pixel data from each of the first memory and the second memory is provided to the video destination with each vertical column of pixels.

In another implementation, a method of storing pixel data in a checkerboard buffer includes: storing pixel data for a first pair of pixels at a first memory address in a first memory device and a second memory device respectively, where the first pair of pixels are the first two pixels in a first horizontal row of pixels in a frame; and storing pixel data for a second pair of pixels at a second memory address in the second memory device and the first memory device respectively, where the second pair of pixels are the first two pixels in a second horizontal row of pixels in a frame and are vertically adjacent to the first pair of pixels.

In another implementation, a method of retrieving pixel data from a checkerboard buffer includes: retrieving pixel data for a first pair of pixels from a first memory address in a first memory device and from a second memory address in a second memory device respectively, where the first pair of pixels are the first two pixels in a first vertical column of pixels in a frame; and retrieving pixel data for a second pair of pixels from the first memory address in the second memory device and from the second memory address in the first memory device respectively, where the second pair of pixels are the first two pixels in a second vertical column of pixels in a frame and are horizontally adjacent to the first pair of pixels.

In another implementation, a method of storing and retrieving pixel data in a checkerboard buffer includes: storing pixel data for a first pixel and a second pixel at a first memory address in a first memory device and a second memory device respectively, where the first pixel and the second pixel are the first two pixels in a first horizontal row of pixels in a frame; storing pixel data for a third pixel and a fourth pixel at a second memory address in the second memory device and the first memory device respectively, where the third pixel and the fourth pixel are the first two pixels in a second horizontal row of pixels in a frame, and the third pixel and the fourth pixel are vertically adjacent to the first pixel and the second pixel, respectively; retrieving pixel data for the first pixel and the third pixel from the first memory address in the first memory device and from the second memory address in the second memory device respectively, where the first pixel and the third pixel are the first two pixels in a first vertical column of pixels in a frame; and retrieving pixel data for the second pixel and the fourth pixel from the first memory address in the second memory device and from the second memory address in the first memory device respectively, where the second pixel and the fourth pixel are the first two pixels in a second vertical column of pixels in a frame and the second pixel and the fourth pixel are horizontally adjacent to the first pixel and the third pixel, respectively.

In another implementation, a method of storing data and retrieving data in a checkerboard buffer includes: storing a first data element and a second data element at a first memory address in a first memory device and a second memory device respectively; storing a third data element and a fourth data element at a second memory address in the second memory device and the first memory device respectively; retrieving the first data element and the third data element from the first memory address in the first memory device and from the second memory address in the second memory device respectively; and retrieving the second data element and the fourth data element from the first memory address in the second memory device and from the second memory address in the first memory device respectively.

BRIEF DESCRIPTION OF THE DRAWINGS

FIG. 9 is a table of addresses and pixel numbers for storing a 1920×1080 frame of pixel data according to the present invention.

FIG. 16 is a table of addresses and pixel numbers for storing a 1920×1080 frame of pixel data according to the present invention.

DETAILED DESCRIPTION

The present invention provides methods and apparatus for storing and retrieving data in parallel but in different orders. This description focuses on implementations where the data is pixel data, however, the present invention is applicable to various types of data that can be accessed in two different orders. As described below, in one implementation, pixels are stored according to a checkerboard pattern, alternately between two memory devices. This pattern advantageously allows pixels to be stored in parallel following a horizontal row of pixels and retrieved in parallel following a vertical column of pixels.

The description below is generally divided into two sections for clarity: A. Checkerboard Buffers; and B. Illustrative Implementations of Checkerboard Buffers.

A. Checkerboard Buffers

A checkerboard buffer provides storage of data in one order and retrieval of data in another order. A checkerboard buffer includes two or more memory devices for parallel storage and retrieval of data. For two memory devices, half of the data is stored in each of the memory devices. As data elements are received, which data is stored to which memory device changes according to the difference between the order data is received and the order data is to be retrieved. The data is stored in the memory devices so that data can be stored to the two devices in one order in parallel and retrieved from the two devices in another order in parallel.

In implementations using video data, the checkerboard buffer is a frame buffer for storing pixel data. Pixel data is supplied to the checkerboard buffer according to the horizontal order of pixels in a frame, such as from left to right, top to bottom. Pixel data is retrieved from the checkerboard buffer according to the vertical order of pixels in a frame, such as from top to bottom, left to right. Pixel data is stored and retrieved for a pair of pixels at a time. Pixel data for one pixel is stored in or retrieved from one memory device and pixel data for the other pixel in or from another memory device.

Figure 6A:
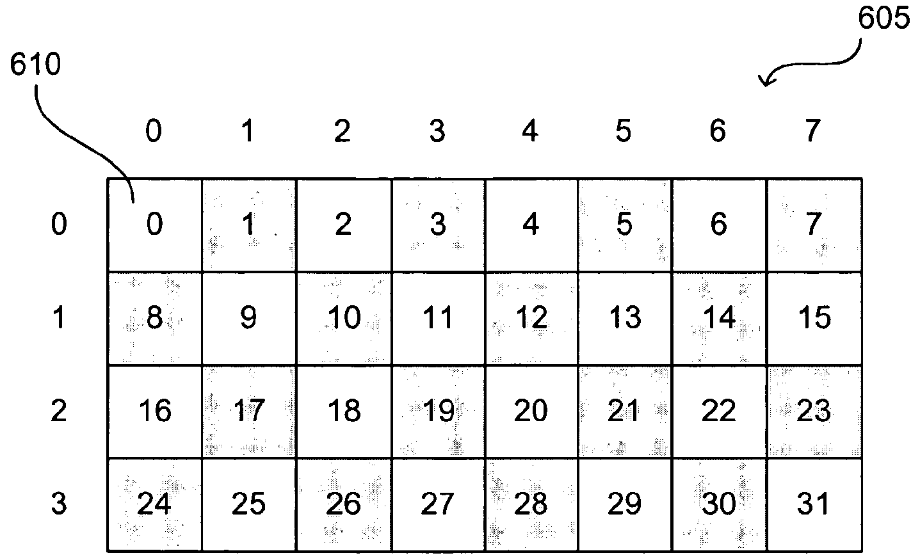
FIG. 6A is a representation of a frame of pixels divided between two memory devices according to the present invention.
Figure 6B:
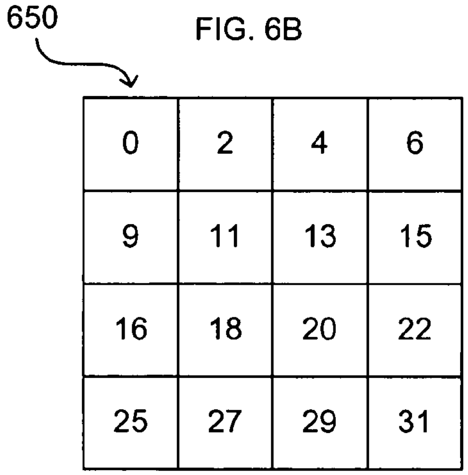
FIG. 6B is a representation of a first memory device according to the present invention.
Figure 6C:
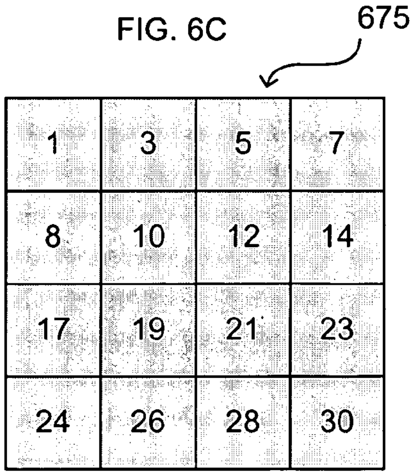
FIG. 6C is a representation of a second memory device according to the present invention.

FIGS. 6A, 6B, and 6C illustrate a checkerboard pattern of storage in two memory devices providing parallel storage and parallel retrieval. FIG. 6A is a representation of a frame 605 of pixels 610 divided between two memory devices. FIG. 6B is a representation of a first memory device 650 and FIG. 6C is a representation of a second memory device 675. Frame 605 has only 32 pixels for simplicity, but typical video frames have many more pixels. For example, one HD resolution has 2,073,600 pixels per frame (1080 horizontal rows with 1920 pixels per row). The description herein of checkerboard buffers focuses on this HD resolution, however, checkerboard buffers can be implemented for various resolutions (e.g., 1280×720, 640×480, etc.).

Each pixel 610 in frame 605 is numbered, starting with pixel 0 in the upper left of frame 605. Each horizontal row is numbered, with the uppermost horizontal row (i.e., pixels 0 . . . 7) numbered 0. Each vertical column is numbered, with the leftmost column (i.e., pixels 0, 8, 16, 24) numbered 0. In FIG. 6A, half of the pixels 610 are shaded (e.g., pixels 1 and 8 are shaded; "shaded" here does not refer to the appearance of pixels when displayed, but only to the representation in the figures of this disclosure). Pixel data for unshaded pixels is stored in first memory device 650 and pixel data for shaded pixels is stored in second memory device 675. The boxes in FIG. 6B and FIG. 6C are also shaded and unshaded to correspond with FIG. 6A.

Each box of memory devices 650 and 675 represents a memory location. Each memory location stores pixel data for one pixel and is numbered according to the pixel that has pixel data stored in that memory location. Accordingly, pixel data is stored in memory devices 650 and 675 in the patterns shown in FIGS. 6B and 6C. Even-numbered pixels in even-numbered horizontal rows are stored in first memory device 650. Even-numbered pixels in odd-numbered horizontal rows are stored in second memory device 675. Odd-numbered pixels in even-numbered horizontal rows are stored in second memory device 675. Odd-numbered pixels in odd-numbered horizontal rows are stored in first memory device 650. Each memory location has an address. The upper left box represents the memory location having address 0, and addresses continue sequentially from left to right, top to bottom. For example, in FIG. 6B, pixel data for pixel 0 is stored at address 0 in memory device 650, pixel data for pixel 2 is stored at address 1, pixel data for pixel 9 is at address 4, and so on. One address can be used to access two memory locations by supplying the address to two memory devices, accessing one memory location in each memory device. For example, by supplying address 0 to memory devices 650 and 675, pixel data stored in the first memory location of each memory device can be retrieved (i.e., pixel data for pixels 0 and 1).

Pixel data for frame 605 would be supplied to the checkerboard buffer in horizontal pixel pairs (i.e., two pixels at a time, one for each memory device) according to the horizontal rows of frame 605. For example, the checkerboard buffer would receive pixel data for pixels in frame 605 according to this sequence of pixel pairs: 0-1, 2-3, 4-5, 6-7, 8-9, 10-11, 12-13, 14-15, 16-17, 18-19, 20-21, 22-23, 24-25, 26-27, 28-29, 30-31. The checkerboard buffer stores the pixel data using this sequence, for two pixels at a time, but changes which memory device receives which pixel data with each row. First memory device 650 receives and stores pixel data for the first pixel in the pixel pair in even-numbered rows and pixel data for the second pixel in the pixel pair in odd-numbered rows. Second memory device 675 receives and stores pixel data for the second pixel in the pixel pair in even-numbered rows and pixel data for the first pixel in the pixel pair in odd-numbered rows. For example, for the first row of pixels, first memory device 650 receives and stores pixel data for pixels 0, 2, 4, and 6, and second memory device receives and stores pixel data for pixels 1, 3, 5, and 7. For the second row of pixels, first memory device 650 receives and stores pixel data for pixels 9, 11, 13, and 15, and second memory device receives and stores pixel data for pixels 8, 10, 12, and 14. This pattern continues for the rest of frame 605. Accordingly, pixel data for the 32 pixels of frame 605 is stored in 16 locations in two memory devices (650 and 675) in 16 parallel operations using horizontal rows.

Pixel data would be retrieved for frame 605 from the checkerboard buffer in vertical pixel pairs (i.e., two pixels at a time, one for each memory device) according to the vertical columns of frame 605. For example, the checkerboard buffer would supply pixel data for pixels in frame 605 according to this sequence of pixel pairs: 0-8, 16-24, 1-9, 17-25, 2-10, 18-26, 3-11, 19-27, 4-12, 20-28, 5-13, 21-29, 6-14, 22-30, 7-15, 23-31. The checkerboard buffer retrieves pixel data using this sequence, for two pixels at a time, but changes which memory device to access for which pixel data with each column. First memory device 650 is accessed and provides pixel data for the first pixel in the pixel pair in even-numbered columns and pixel data for the second pixel in the pixel pair in odd-numbered columns. Second memory device 675 receives and stores pixel data for the second pixel in the pixel pair in even-numbered columns and pixel data for the first pixel in the pixel pair in odd-numbered columns. For example, for the first column of pixels, first memory device 650 provides pixel data for pixels 0 and 16, and second memory device provides pixel data for pixels 8 and 24. For the second column of pixels, first memory device 650 provides pixel data for pixels 9 and 25, and second memory device provides pixel data for pixels 1 and 17. This pattern continues for the rest of frame 605. Accordingly, pixel data for the 32 pixels of frame 605 can be retrieved in 16 parallel operations using vertical columns.

Figure 1A:
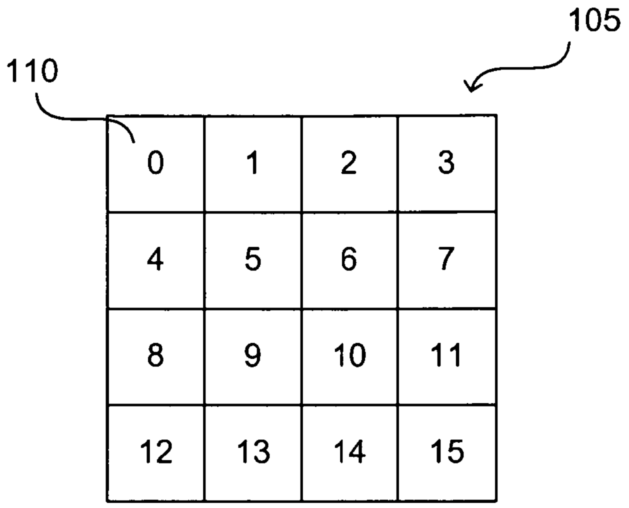
FIG. 1A is a representation of a screen as a grid of pixels.
Figure 1B:
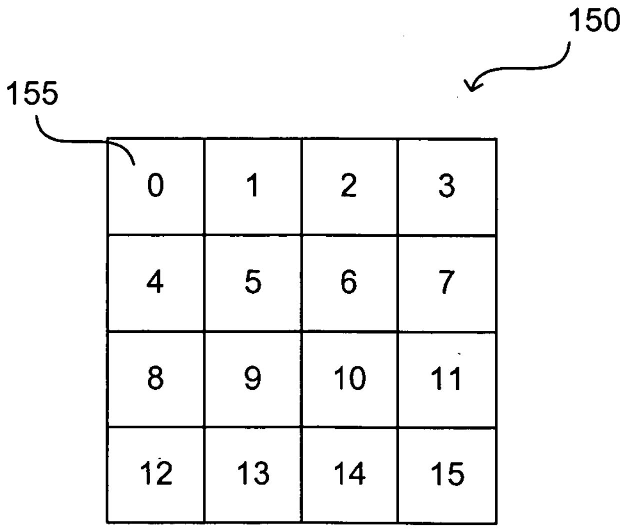
FIG. 1B is a representation of a frame buffer as a grid of memory locations.
Figure 2:
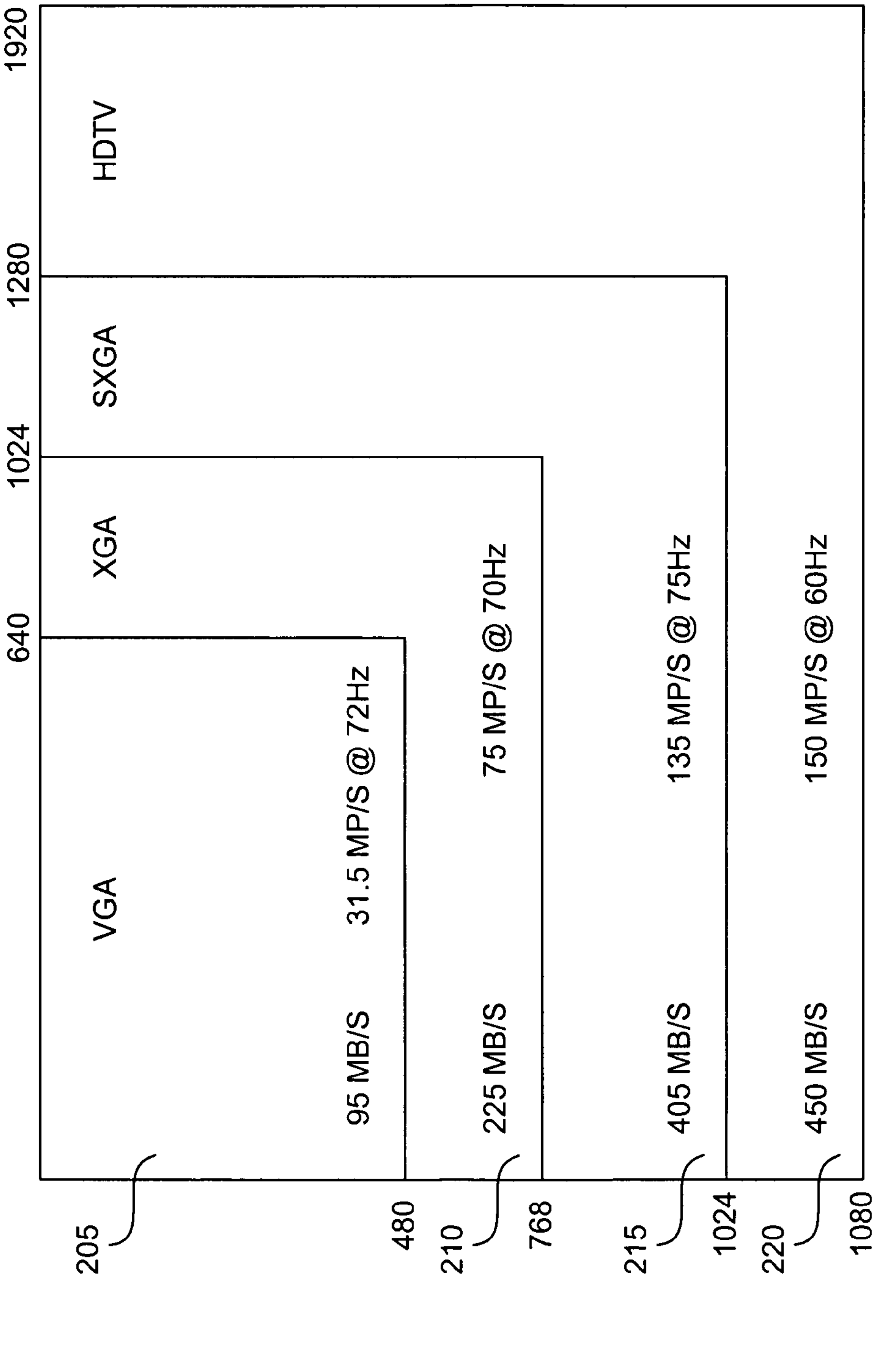
FIG. 2 is a representation of screen resolutions and typical data throughput requirements.
Figure 3A:
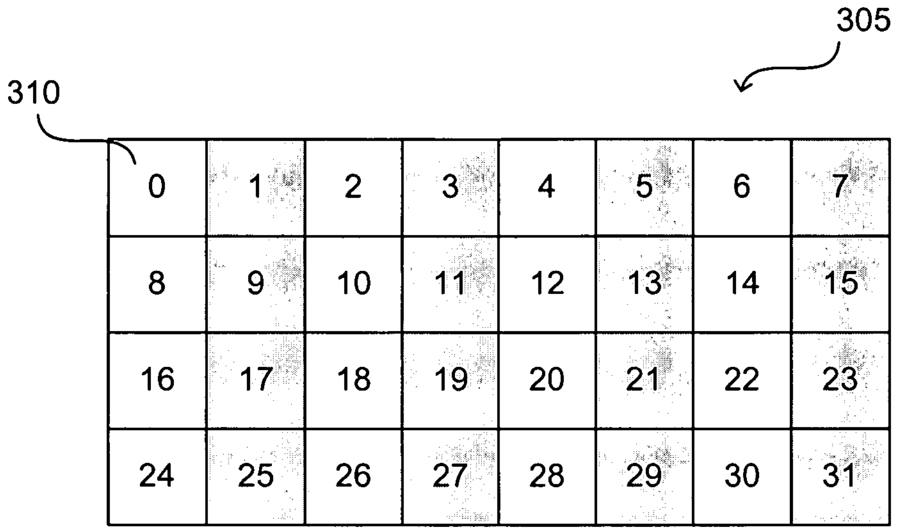
FIG. 3A is a representation of a frame of pixels divided between two memory devices.
Figure 3B:
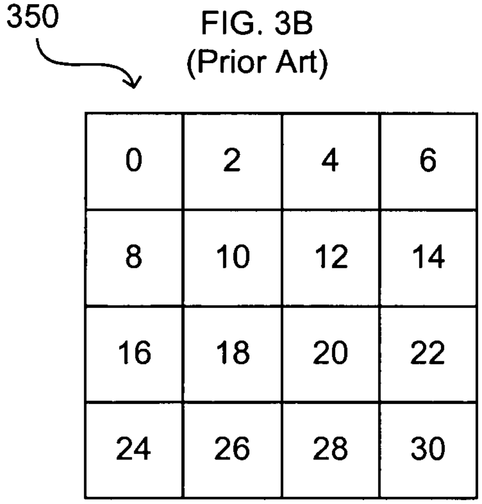
FIG. 3B is a representation of a first memory device.
Figure 3C:
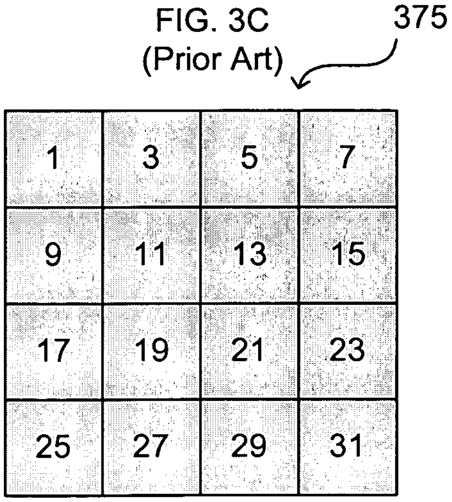
FIG. 3C is a representation of a second memory device.
Figure 4:
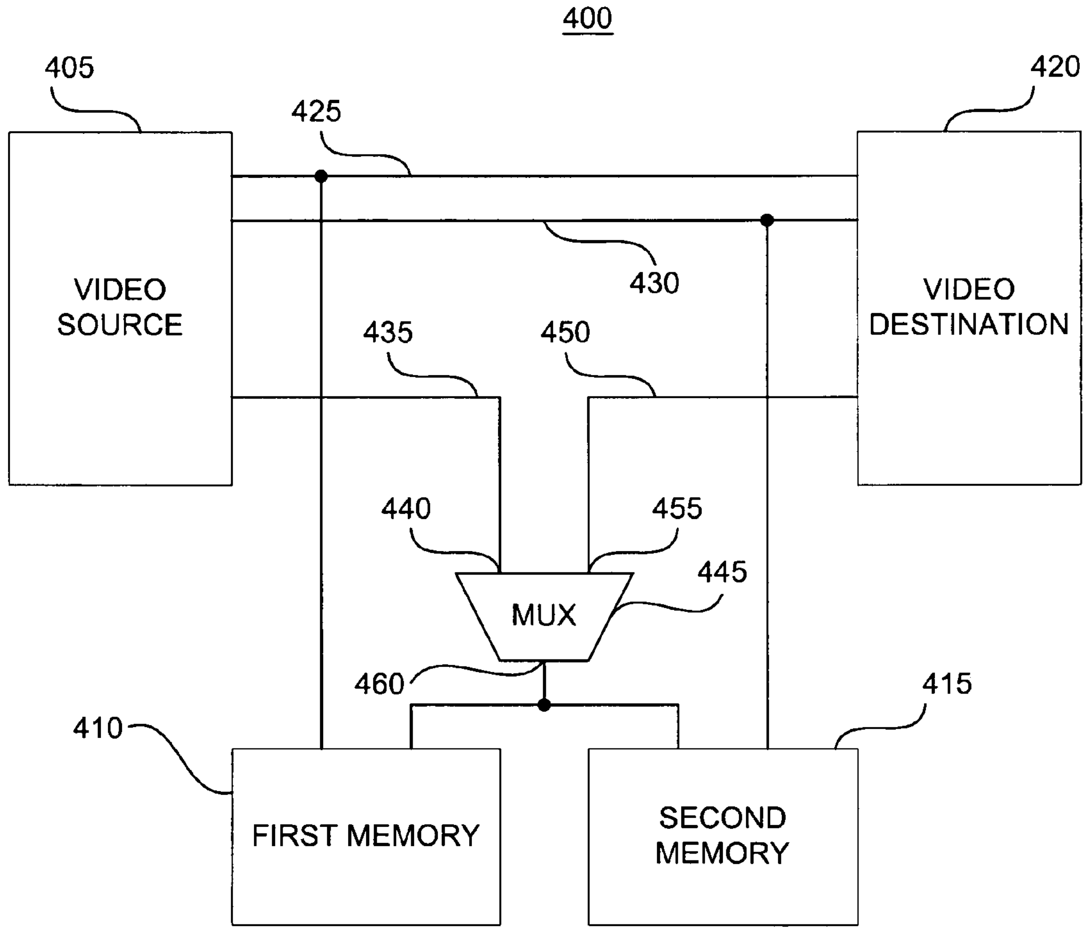
FIG. 4 is a block diagram of a dual pixel frame buffer architecture supporting the representations shown in FIGS. 3A, 3B, and 3C.
Figure 5:
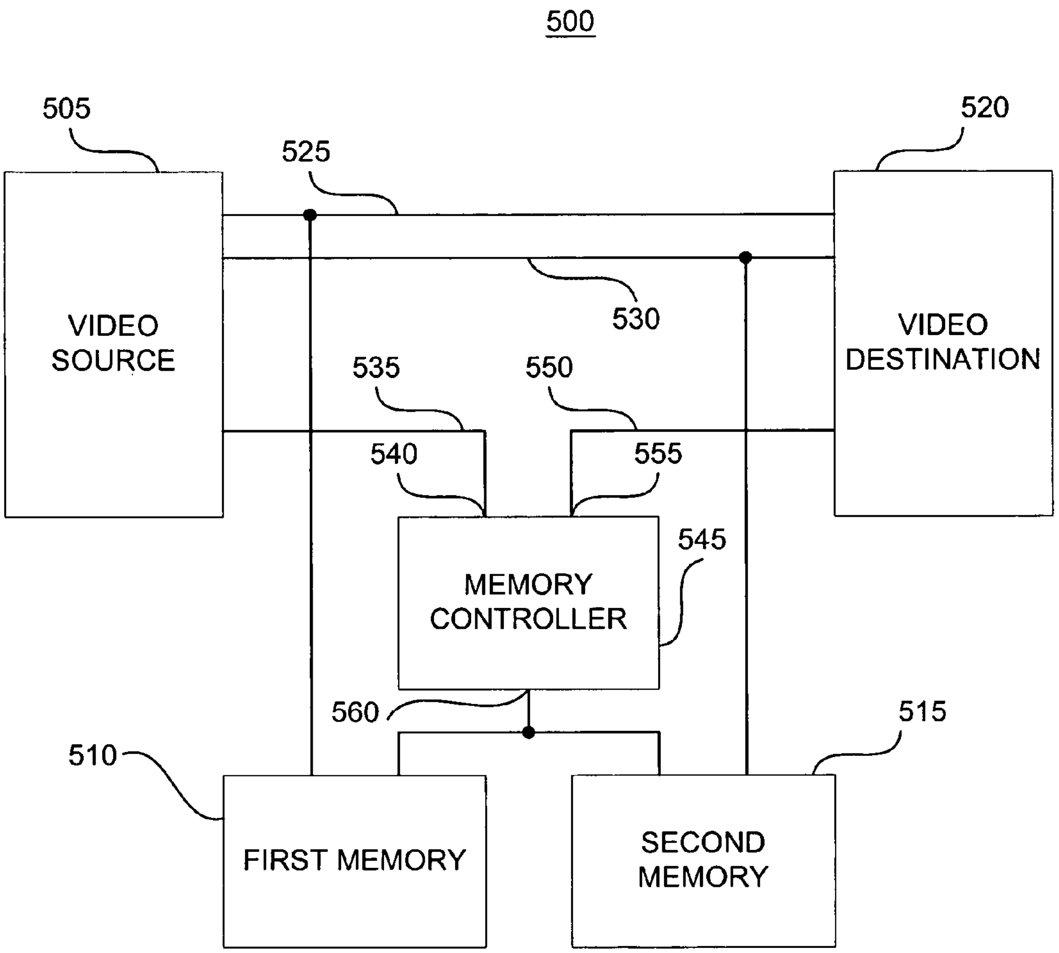
FIG. 5 is a block diagram of a dual pixel frame buffer architecture including a memory controller.

By comparison, in the storage pattern shown in FIGS. 3A, 3B, and 3C, while pixels 0 and 1 can be retrieved in parallel from different memory devices, pixels 0 and 8 cannot. Pixels 0 and 8 are both stored in the same device, first memory device 350 in FIG. 3B. The checkerboard buffer allows parallel storage for horizontal rows of pixels and parallel retrieval for vertical columns of pixels because the pixel data for each horizontal row of pixels is divided between two memory devices and the pixel data for each vertical column of pixel is also divided between two memory devices.

Figure 7:
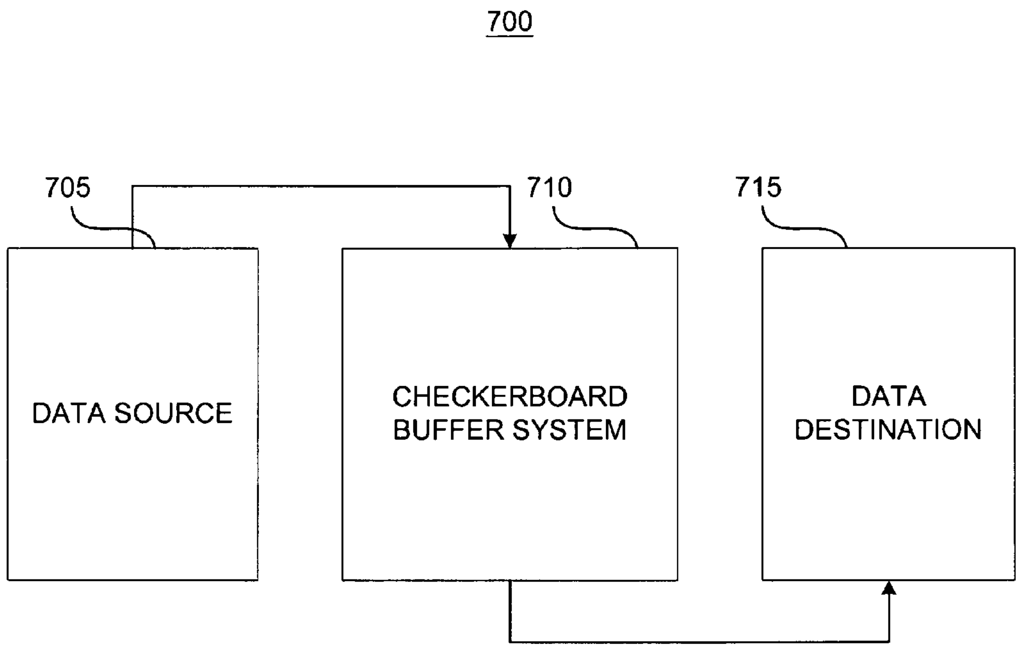
FIG. 7 is a block diagram of a data system according to the present invention.

FIG. 7 is a block diagram of a data system 700. A data source 705 provides data to a checkerboard buffer system 710 in a first order. Checkerboard buffer system 710 stores the data in a checkerboard pattern, as described above. Checkerboard buffer system 710 retrieves the data in a second order and provides the retrieved data to a data destination 715.

Data source 705 can be a video source providing pixel data to checkerboard buffer system 710 and data destination 715 can be a display system. In this case, data source 705 provides pixel data according to horizontal rows of pixels and data destination 715 receives pixel data according to vertical columns of pixels, as described above. Checkerboard buffer system 710 provides the conversion.

Data source 705 can be implemented to provide pixel data according to various screen resolutions, such as a high definition ("HD") resolution of 1920×1080. While the discussion herein focuses on this HD resolution, alternative implementations can accommodate other resolutions. For an HD resolution signal, data source 705 provides pixel data for a progressive signal (e.g., 1920×1080p). Data source 705 can be implemented to receive an interlaced signal (e.g., 1920×1080i) and provide a progressive signal, such as by merging interlaced fields. In an alternative implementation, data source 705 provides an interlaced signal, providing pixel data for half the screen pixels (i.e., first field) and then pixel data for the other half (i.e., second field). In another implementation, data source 705 provides pixel data using progressive segmented frames ("PSF," by Sony Corporation of Japan, Inc.).

Each pixel has 32 bits of pixel data. In one implementation, 11 bits are for red, 11 bits are for green, and 10 bits are for blue. Alternative implementations may have different allocations (e.g., 10 bits per color) or pixel depths (e.g., 8 or 24 bits per pixel). Where data source 705 provides pixel data at 1920×1080p and 32 bits per pixel, the pixel rate is approximately 150 MP/S and the data rate from data source 705 is approximately 600 MB/S. Accordingly, checkerboard buffer system 710 stores pixel data from data source 705 at a data rate of approximately 600 MB/S. To provide pixel data at a rate to support the same resolution, 1920×1080p, checkerboard buffer system 710 outputs pixel data to data destination 715 at a data rate of approximately 600 MB/S.

Data destination 715 can be a GLV system. A color GLV system includes three GLV's: one for red, one for green, and one for blue. As described above, a GLV uses vertical columns of pixels to form an image (projecting one column at a time, typically left to right). In a color GLV system, each GLV projects a column of pixels (e.g., 1088 pixels, though only 1080 may have corresponding pixel data from the video data source) at a time. The three color columns are combined (such as using mirrors and lenses) to form a single apparent column on the viewing area (not shown in FIG. 7). Accordingly, it is advantageous for the GLV system to receive pixel data according to vertical columns of pixels, rather than horizontal rows. Checkerboard buffer system 710 provides the pixel data to the GLV system corresponding to vertical columns of pixels. In alternative implementations, data destination 715 can be some other video device that uses pixel data corresponding to vertical columns of pixels, such as a graphics card or a video image processor (e.g., for image transformations).

B. Illustrative Implementations of Checkerboard Buffers

This section describes several additional illustrative implementations of checkerboard buffers. However, the described implementations are illustrative and those skilled in art will readily appreciate additional implementations are possible. The illustrative implementations are described in separate numbered and labeled sections. However, compatible aspects of the implementations can be combined in additional implementations.

1. Checkerboard Frame Buffer Using Two Memory Devices

Figure 8:
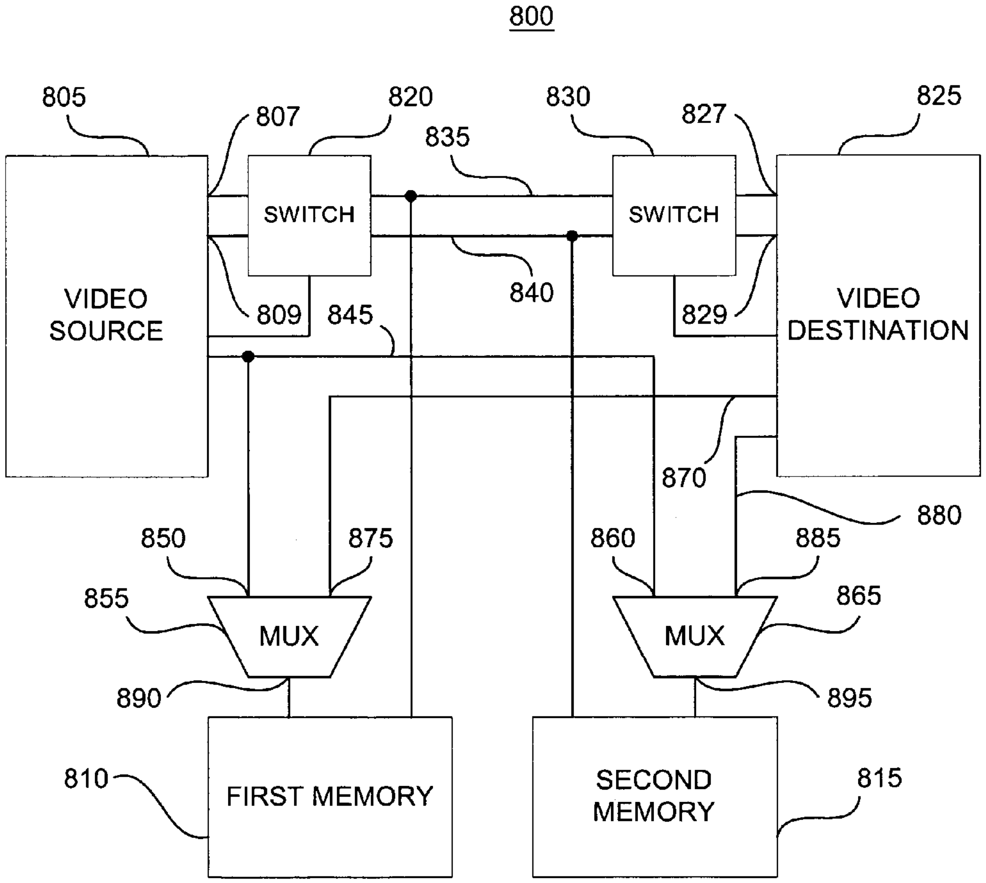
FIG. 8 is a block diagram of a switching dual pixel frame buffer architecture according to the present invention.

FIG. 8 is a block diagram of a switching dual pixel frame buffer architecture 800 supporting the representations shown in FIGS. 6A, 6B, and 6C. Architecture 800 can implement checkerboard buffer system 710 in FIG. 7. A video source 805 provides pixel data to a first memory 810 (e.g., first memory device 650 in FIG. 6B) and to a second memory 815 (e.g., second memory device 675 in FIG. 6C) in parallel through a first data switch 820. A video destination 825 retrieves pixel data from first memory 810 and from second memory 815 in parallel through a second data switch 830.

First memory 810 and second memory 815 are separate memory devices such as 32-bit wide 8 MB SDRAM's (e.g., 2M×32 SDRAM MT48LC2M32B2 by Micron Technology, Inc.). The SDRAM is preferably fast enough to support the data rate needed for the screen resolution, such as 125 MHZ or 150 MHZ. Other types of memory can also be used, such as DDR SDRAM (double data rate SDRAM) or SGRAM (synchronous graphics RAM). Memories 810 and 815 each store half the pixel data of a particular frame, half for each row of pixels and half for each column of pixels. In this implementation, pixel data for each pixel is stored in a separately addressable 32-bit memory location, 32 bits per pixel. In alternative implementations, pixel data for each pixel could be split across memory locations or pixel data for multiple pixels could be stored in a single memory location.

Data switches 820 and 830 switch connections to alternate properly between memories 810 and 815, as described below. A first data bus 835 is connected to first data switch 820, first memory 810, and second data switch 830. A second data bus 840 is connected to first data switch 820, second memory 815, and second data switch 830.

Video source 805 receives video data from another source (not shown), such as data source 705 in FIG. 7, a broadcast source, or a software application running on a computer system connected to video source 805. Video source 805 outputs pixel data for pixels two at a time, a first pixel at a first source output 807 and a second pixel at a second source output 809. First data switch 820 has two states: providing the pixel data at first source output 807 to first memory 810 and the pixel data at second source output 809 to second memory 815; and providing the pixel data at first source output 807 to second memory 815 and the pixel data at second source output 809 to first memory 810. Video source 805 provides a control signal to first data switch 820 to control the state of first data switch 820. This control signal can be based on the address provided by video source 805 (such as address bit A10 as described below), or linked to the horizontal synchronization signal for the frame received by video source 805. Video source 805 includes a flip-flop (not shown) to toggle the state of first data switch 820. For example, in one implementation, the horizontal synchronization signal toggles the flip-flop, which in turn toggles the state of first data switch 820. In this way, the state of first data switch 820 changes with each horizontal row of pixels. In another implementation, video source 805 can provide all or part of the address to first data switch 820 for state control.

Video destination 825 provides pixel data to a display system, such as data destination 715 in FIG. 7 implemented as a GLV system. Video destination 825 receives pixel data for pixels two at a time, a first pixel at a first destination input 827 and a second pixel at a second destination input 829. Second data switch 830 has two states: providing the pixel data from first memory 810 to first destination input 827 and the pixel data from second memory 815 to second destination input 829; and providing the pixel data from second memory 815 to first destination input 827 and the pixel data from first memory 810 to second destination input 829. Video destination 825 provides a control signal to second data switch 830 to control the state of second data switch 830. This control signal can be based on the address provided by video destination 825 (such as bit C0 from a column counter, as described below). Video destination 825 includes a flip-flop (not shown) to toggle the state of second data switch 830. For example, in one implementation, a counter or an address bit toggles the flip-flop, which in turn toggles the state of second data switch 830. In this way the state of second data switch 830 changes with each vertical column of pixels. In another implementation, video destination 825 can provide all or part of the address to second data switch 830 for state control.

A source address bus 845 is connected to video source 805, a first input 850 of a first address multiplexor 855, and a first input 860 of a second address multiplexor 865. A first destination address bus 870 is connected to video destination 825 and a second input 875 of first address multiplexor 855. A second destination address bus 880 is connected to video destination 825 and a second input 885 of second address multiplexor 865. An output 890 of first address multiplexor 855 is connected to first memory 810. An output 895 of second address multiplexor 865 is connected to second memory 815. Accordingly, the same address is provided by video source 805 to both first memory 810 and second memory 815 to store pixel data while different addresses are provided by video destination 825 to first memory 810 and second memory 815 to retrieve data. Address multiplexors 855 and 865 receive control signals at control inputs (not shown) to control which input is connected to the output. Memories 810 and 815 also receive control signals at control inputs (not shown) to control whether memories 810 and 815 will read in data (write mode) or read out data (read mode). In addition, while clock lines are not shown in FIG. 8, architecture 800 operates based on clock cycles so that pixel data can be processed for two pixels per clock cycle in support of the desired pixel rate. In alternative implementations, as described below referring to FIGS. 18 and 19, address generation and switching can be controlled by a memory controller.

Referring again to FIGS. 6A, 6B, and 6C, for frame 605, video source 805 would supply pixel data for horizontal pixel pairs at source outputs 807 and 809 in this sequence (first source output-second source output): 0-1, 2-3, 4-5, 6-7, 8-9, 10-11, 12-13, 14-15, 16-17, 18-19, 20-21, 22-23, 24-25, 26-27, 28-29, 30-31. Because of first data switch 820, first memory 810 would receive this sequence of pixel data: 0, 2, 4, 6, 9, 11, 13, 15, 16, 18, 20, 22, 25, 27, 29, 31. Second memory 820 would receive this sequence: 1, 3, 5, 7, 8, 10, 12, 14, 17, 19, 21, 23, 24, 26, 28, 30. In contrast, for frame 605, first memory 810 would provide pixel data for pixels in this sequence: 0, 16, 9, 25, 2, 18, 11, 27, 4, 20, 13, 29, 6, 22, 15, 31. Second memory 815 would provide pixel data for pixels in this sequence: 8, 24, 1, 17, 10, 26, 3, 19, 12, 28, 5, 21, 14, 30, 7, 23. Because of second data switch 830, video destination would receive pixel data for vertical pixel pairs at destination inputs 827 and 829 in this sequence (first destination input-second destination input): 0-8, 16-24, 1-9, 17-25, 2-10, 18-26, 3-11, 19-27, 4-12, 20-28, 5-13, 21-29, 6-14, 22-30, 7-15, 23-31. Accordingly, pixel data for the 32 pixels of frame 605 would be stored in 16 locations in two memories (810 and 815). The pixel data would be stored in 16 parallel operations using horizontal rows and retrieved in 16 parallel operations using vertical columns.

In operation, memories 810 and 815 read in or store complementary portions of a frame of pixels as pixel data from video source 805 and output the pixel data to video destination 825. Data switches 820 and 830 ensure the proper alternation of connections to memories 810 and 815 to provide the checkerboard pattern represented in FIG. 6A. As described above, pixel data for a frame of pixels from video source 805 is stored according to horizontal rows of pixels, and then the pixel data is retrieved according to vertical columns of pixels and provided to video destination 825. After the pixel data for the entire frame has been retrieved, pixel data for the next frame is stored, and so on. Some pixel data for the next frame may be buffered, such as in video source 805, while pixel data for the previous frame is being retrieved. As described below, in alternative implementations, the storage and retrieval can be interleaved or occur in parallel.

FIG. 9 is a table 900 of addresses 905 and pixel numbers 910 for storing a 1920×1080 frame of pixel data. Pixel numbers 910 indicate for each address 905 in two memories (e.g., memories 810 and 815 in FIG. 8) the pixel for which pixel data is stored at that address 905 in each memory. FIG. 9 shows only a small number of addresses for illustration. Ellipses indicate intervening addresses or data. Some addresses are not used, indicated by "UNUSED."

1024 memory locations 905 are allocated in each memory device to each row of 1920 pixels. For example, pixel data for pixel 0 is stored at address 0 in first memory 810 and pixel data for pixel 1 is stored at address 0 in second memory 815. Pixel data for horizontal pixel pair 1918-1919 (i.e., the last two pixels of the first horizontal row) is stored at address 959 in first memory 810 and second memory 815, respectively. In the next horizontal row of pixels, pixel data for pixel-pair 1920-1921 is stored at address 1024 in second memory 815 and first memory 810, respectively. Addresses 960 to 1023 are not used for storing pixel data in this implementation. A similar pattern is followed for each horizontal row, so that the address for the first pixel pair of each horizontal row is a multiple of 1024 (i.e., 0, 1024, 2048, 3072, . . . , 1104896).

As described below, it is convenient for the address of the memory location for the first pixel pair of each horizontal row to be a power of 2 so that addresses can be generated by merging counters. In HD resolution, each horizontal row has 1920 pixels. Each memory stores pixel data for half of the pixels in a horizontal row and one-half of a row is 960 pixels. The next largest power of 2 over 960 is 1024, so pixel data for each horizontal row of 1920 pixels is allocated 1024 memory locations.

Before describing the overall operation of storing pixel data to memories 810 and 815, it will be useful to describe examples of implementations of how addresses are calculated for storing pixel data. Video source 805 generates addresses to store pixel data for horizontal pixel pairs according to horizontal rows of pixels. In an HD resolution implementation, video source 805 stores pixel data for pixel pairs in this sequence: 0-1, 2-3, 4-5, and so on. Referring to FIG. 9, video source 805 generates addresses in the following sequence (one address for each pixel pair): 0, 1, 2, . . . , 959, 1024, 1025, . . . , 1983, 2048, 2049, and so on. As described above, pixel data for pixels of a horizontal pixel pair are stored at the same address in respective memory devices, switching memory devices with each row.

In one implementation, video source 805 includes an address counter, and increments the counter by 1 for pixel data for each pixel pair output to source outputs 807 and 809. For example, for pixels 0 and 1, the counter is 0. For pixels 2 and 3, the counter is 1. In an alternative implementation, the counter can be incremented by 1 for pixel data for each pixel, and the lowest order bit of the counter is dropped before the counter value is used as an address. The value of the counter is output to source address bus 845.

Figure 10:
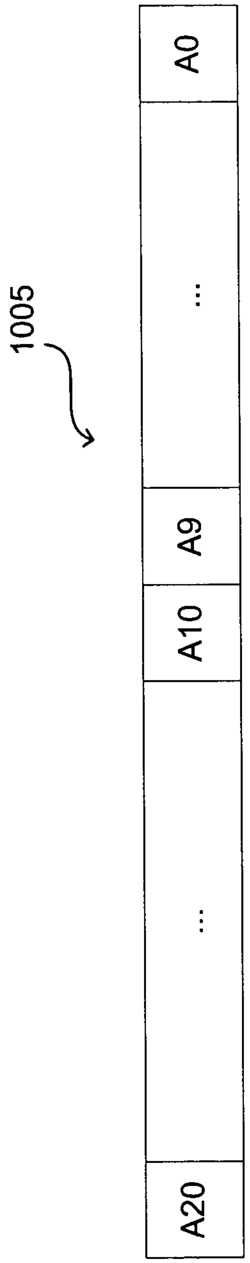
FIG. 10 is a representation of address bits in a counter according to the present invention.

FIG. 10 is a representation of an address counter 1005 for video source 805. Counter 1005 has 21 bits labeled A0 to A20, enough bits to address every location in memories 810 and 815. As described above, memories 810 and 815 can each be implemented as 32-bit wide 8 MB SDRAM's and so each can have $2^{21}$ (2,097,152) four-byte locations (to accommodate 32 bits per pixel). In HD resolution, one frame has 1080 horizontal rows, so there are 1,105,856 locations to address (1024×1079+960=1105856). Accordingly, counter 1005 has 21 bits (20 bits would range from 0 to 1,048,575). As described above, a GLV typically has 1088 pixels, creating an extra eight rows of pixels, so memories 810 and 815 may store constant data (such as black) for these extra 8 rows of pixels when supplying pixel data to a GLV.

Because the first pixel pair of each horizontal row has an address that is a multiple of 1024, the first ten bits of counter 1005 (starting from the lowest order bit, A0 . . . A9; ten bits can express 0 to 1023) can be viewed as a column counter indicating a pixel pair in a horizontal row and the upper eleven bits (A10 . . . A20) can be viewed as a row counter indicating a horizontal row. In this view, combining the two counters produces an address. Furthermore, as video source 805 increments the counter, the eleventh bit (A10) of the address, which can be viewed as the lowest order bit of the row counter, changes at the beginning of each horizontal row. Accordingly, video source 805 can use this bit to toggle a flip-flop controlling the state of first data switch 820, causing the alternation between memories 810 and 815 in storing pixels.

Figure 11:
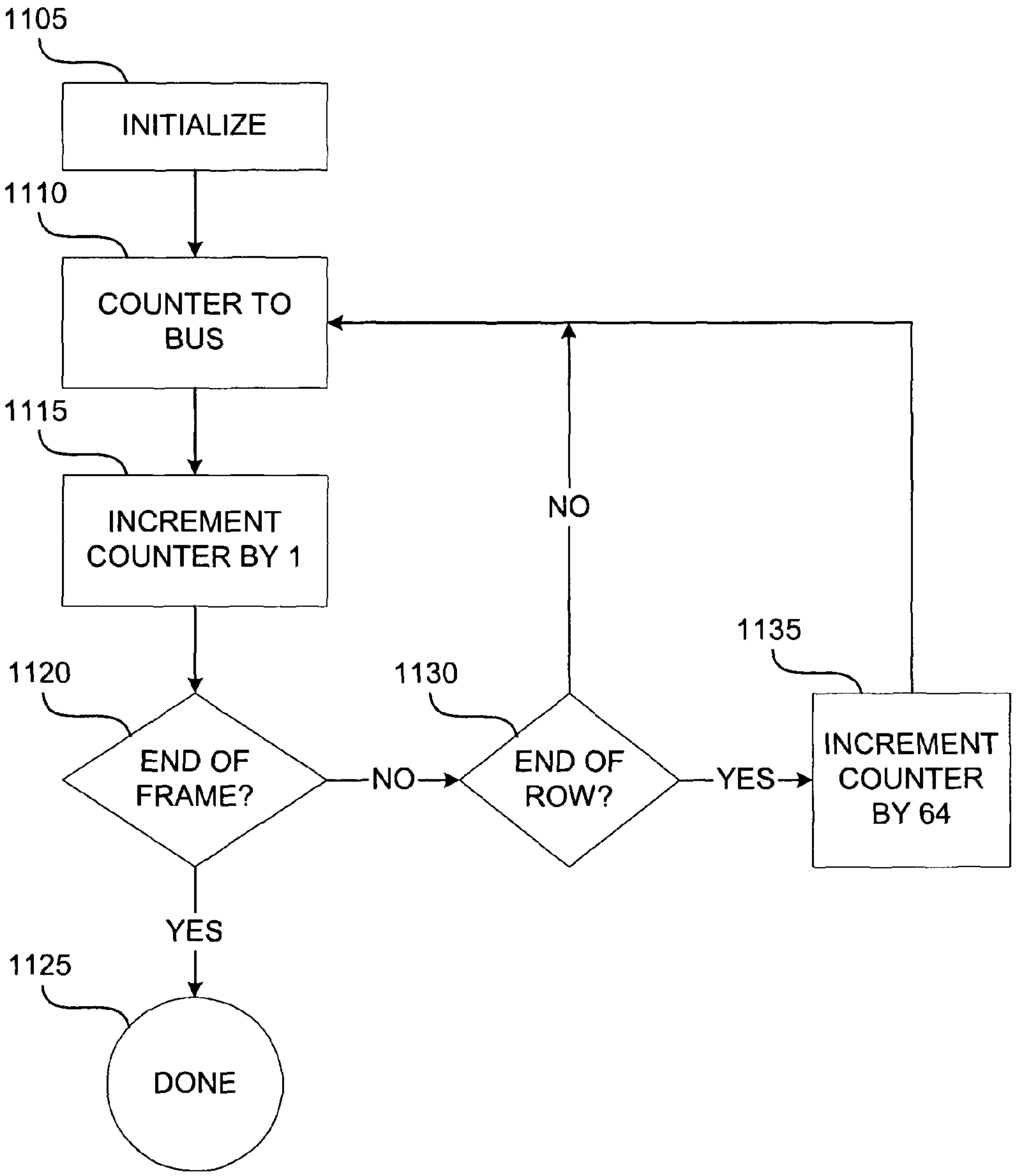
FIG. 11 is a flowchart of generating addresses for storing pixel data for a frame of pixels according to the present invention.

FIG. 11 is a flowchart of generating addresses for storing pixel data for a frame of pixels in an HD resolution implementation using 1024 locations in each memory per row of pixels. At the beginning of a frame, video source 805 resets counter 1005 to 0, block 1105. Video source 805 provides the value of counter 1005 to source address bus 845, block 1110. Video source 805 increments counter 1005 by 1, block 1115. Video source 805 compares the value of counter 1005 to a maximum frame value to check if the last pixel pair in the frame has been processed, block 1120. The maximum frame value depends on the implementation. If the maximum frame value has been reached, address generation for the current frame is complete, block 1125. If the maximum frame value has not been reached, video source 805 compares the value of the low order 10 bits of counter 1005 to a maximum row value (e.g., 960) to check if the last pixel in a horizontal row has been processed, block 1130. If the maximum row value has been reached, video source 805 increments counter 1005 by 64 (e.g., from 960 to 1024, or from 1984 to 2048), block 1135, and returns to block 1110. In an alternative implementation, video source 805 increments the counter by 64 based on receiving the horizontal synchronization signal. If the maximum row value has not been reached, video source 805 proceeds with block 1110. When storing pixel data for a new frame, video source 805 starts generating addresses again beginning with block 1105.

Figure 12:
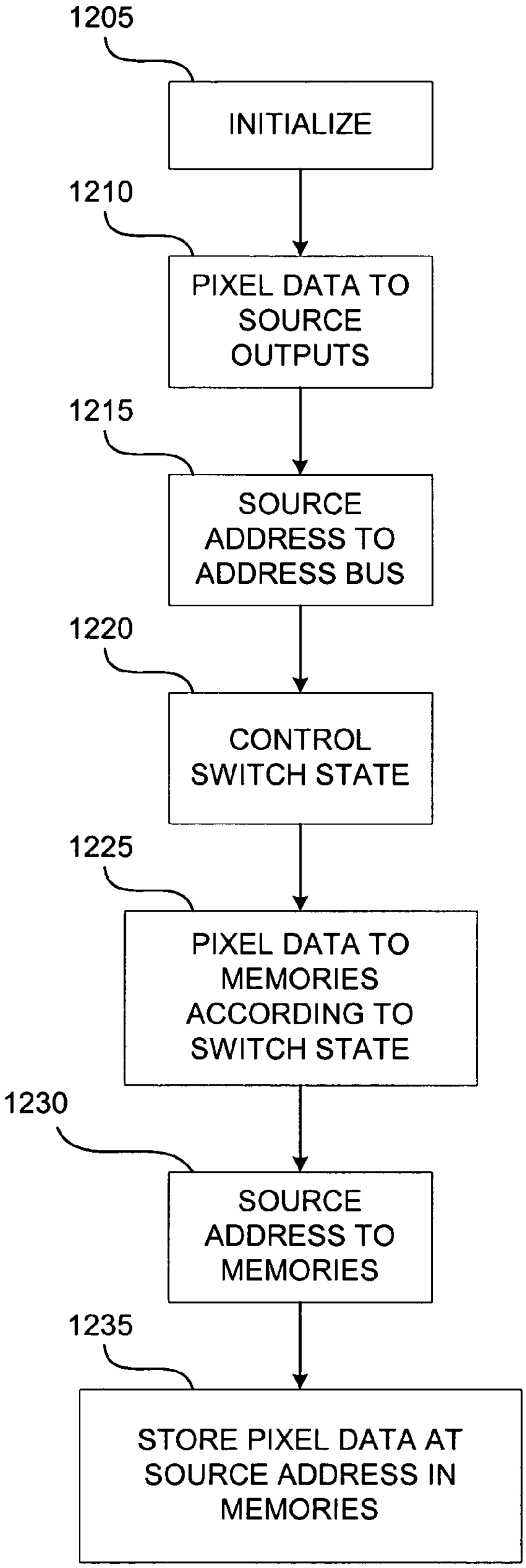
FIG. 12 is a flowchart of storing pixel data according to the present invention.

FIG. 12 is a flowchart of storing pixel data. To store pixel data, memories 810 and 815 are put in write mode and address multiplexors 855 and 865 are set to connect first inputs 850 and 860 to outputs 890 and 895, respectively, block 1205. Video source 805 provides pixel data for a first pixel to first source output 807, such as pixel 0 in FIG. 6A, and pixel data for a second pixel to second source output 809, such as pixel 1 in FIG. 6A, block 1210. Video source 805 also provides an address to source address bus 845, which in turn provides the address to first input 850 of first address multiplexor 855, and first input 860 of second address multiplexor 865, block 1215. As described above, video source 805 uses a counter to calculate the address, and increments the counter by 1 for each pixel pair. At the beginning of each frame, video source 805 resets this counter.

Video source 805 provides a control signal to first data switch 820 to control which pixel data to send to which memory, block 1220. Alternatively, video source 805 provides a control signal to first data switch 820 when the state of first data switch 820 is to change. Video source 805 causes first data switch 820 to change states when pixel data for a complete row of pixels has been stored. As described above, video source 805 toggles a flip-flop connected to first data switch 820, such as by using one of the address bits (e.g., bit A10). In one state, first data switch 820 provides pixel data from first source output 807 to first data bus 835 and pixel data from second source output 809 to second data bus 840. In the other state, first data switch 820 provides pixel data from first source output 807 to second data bus 840 and pixel data from second source output 809 to first data bus 835. In another implementation, video source 805 toggles a flip-flop connected to first data switch 820 based on the horizontal synchronization signal or the counter value (e.g., when the counter equals a multiple of 960) to change states.

First data bus 835 provides its pixel data to first memory 810 and second data bus 840 provides its pixel data to second memory 815, block 1225. Address multiplexors 855 and 865 provide the address from source address bus 845 to first memory 810 and second memory 815, block 1230. First memory 810 stores the pixel data on first data bus 835 at the address supplied by address multiplexor 855 from video source 805 and second memory 815 stores the pixel data on second data bus 840 at the same address, block 1235. Two pixels have been stored in parallel in two respective memories using the same address. Referring to FIGS. 6A, 6B, and 6C, pixel 0 and pixel 1 are stored at the same time at the same address in first memory device 650 and second memory device 675, respectively. To store pixel data for the next two pixels, video source 805 returns to block 1210, or to block 1205 to restore the state of architecture 800 for storage.

Before describing the overall operation of retrieving pixel data from memories 810 and 815, it will be useful to describe examples of implementations of how addresses are calculated for retrieving pixel data. Video destination 825 retrieves pixel data corresponding to vertical columns of pixels, but video source 805 has stored pixel data in memories 810 and 815 using horizontal rows of pixels. Accordingly, pixel data for vertically adjacent pixels do not have adjacent memory addresses. For example, referring to FIGS. 6A, 6B, and 6C, pixels 0, 8, 16, and 24 are a series of vertically adjacent pixels, forming a vertical column. However, pixel data for pixels 0 and 16 are not at neighboring addresses in first memory device 650 (pixel data for pixels 15 and 18 are at neighboring addresses to pixel data for pixel 16). Furthermore, pixel data for the vertical pixel pairs retrieved by video destination 825 do not have the same address, in contrast with the horizontal pixel pairs in storing pixels. For example, video destination 825 would retrieve pixels 0 and 8 in parallel from memory devices 650 and 675, respectively, but pixel 0 is at address 0 in first memory device 650 and pixel 8 is at address 4 in second memory device 675.

In an HD resolution implementation, video destination 825 retrieves pixel data for vertical pixel pairs in this sequence: 0-1920, 3840-5760, . . . , 1-1921, 3841-5761, and so on. Video destination 825 generates a pair of addresses for each vertical pixel pair. One address is supplied to first memory 810 and one address is supplied to second memory 815. Referring to FIG. 9, video destination 825 generates addresses in the following sequence: 0-1024, 2048-3072, . . . , 0-1024, 2048-3072, . . . , 1-1025, 2049-3073, and so on. The same sequence of addresses can be used for two columns of pixels, however, which memory receives which address changes with each column. In the first column, first memory 810 receives the first address in the pair of addresses, and in the second column, first memory 810 receives the second address. For example, for the first vertical pixel pair in the first column, first memory 810 receives address 0 (pixel 0) and second memory 815 receives address 1024 (pixel 1920). For the first vertical pixel pair in the second column, first memory 810 receives address 1024 (pixel 1921) and second memory 815 receives address 0 (pixel 1).

Figure 13:
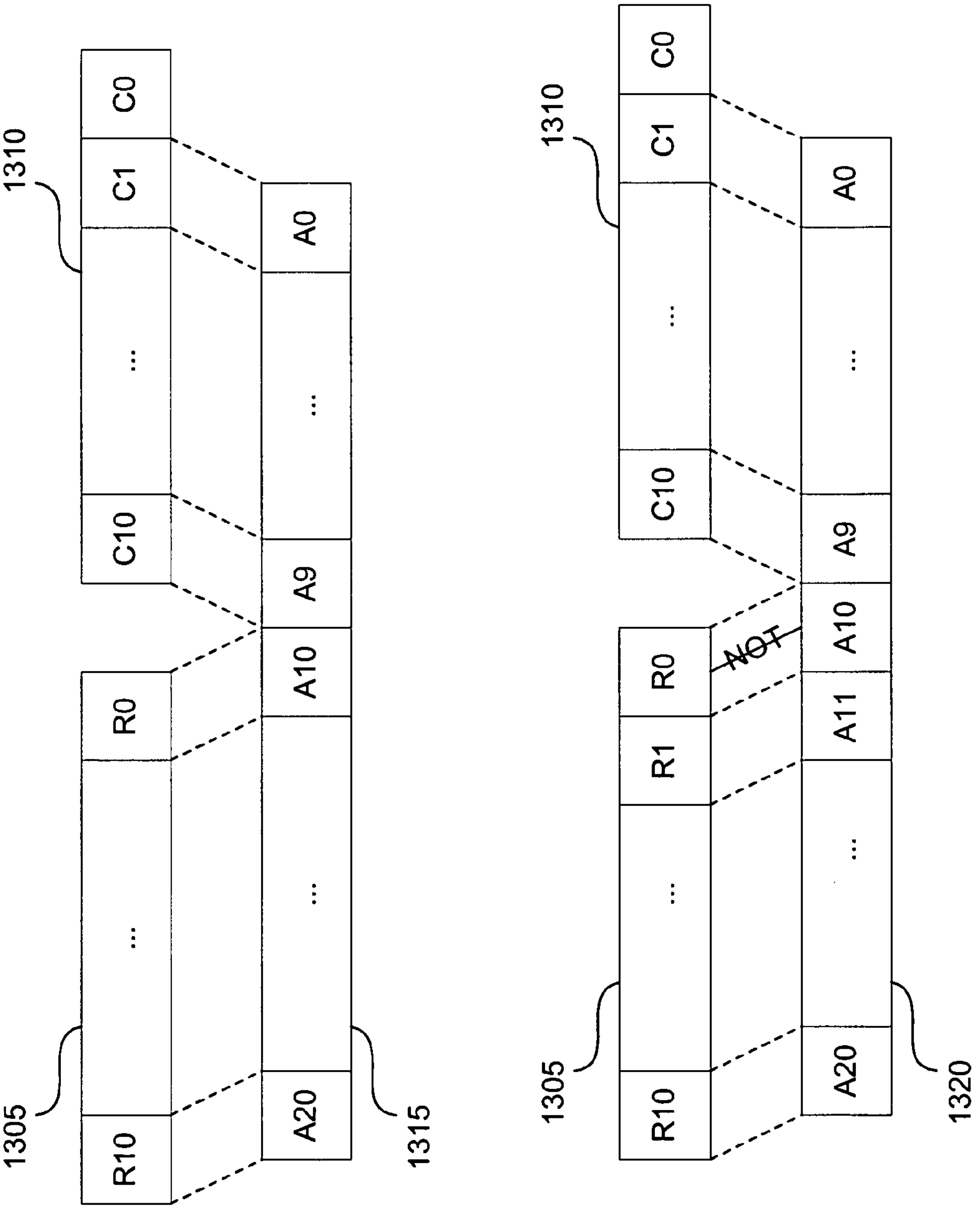
FIG. 13 is a representation of generating destination addresses according to the present invention.

FIG. 13 is a representation of generating destination addresses. Video destination 825 includes two address counters: a row counter 1305, and a column counter 1310. Row counter 1305 indicates horizontal rows and column counter 1310 indicates vertical columns. Row counter 1305 has 11 bits, ranging from 0 to 2047, to accommodate all 1080 horizontal rows in the frame. Column counter 1310 has 11 bits, ranging from 0 to 2047, to accommodate all 1920 vertical columns in the frame. In combination, the counters can indicate a pixel in the frame. Video destination 825 combines the values of row counter 1305 and column counter 1310 to produce a first destination address 1315. The upper 10 bits of column counter 1310 form the low order bits of first destination address 1315 and row counter 1305 forms the high order bits. As described below, bit C0 is not used in the destination addresses. Video destination 825 also combines the values of row counter 1305 and column counter 1310 to produce a second destination address 1320. The upper 10 bits of column counter 1310 form the low order bits of second destination address 1320. The eleventh bit (A10) of second destination address 1320 is the complement of the low order bit (R0) of row counter 1305 (i.e., if R0 equals 0, A10 equals 1, and if R0 equals 1, A10 equals 0). This complement causes the second destination address 1320 to be 1024 greater than (i.e., one row ahead) or 1024 less than (i.e., one row behind) the first destination address 1315. The remaining bits of row counter 1305 (R1 to R10) form the remaining high order bits of second destination address 1320 (A11 to A20). In another implementation, video destination 825 uses a pair of counters, offset by the width of the frame, to generate first and second destination addresses. As described above, memories 810 and 815 can be implemented each as 8 MB SDRAM's, having 2,097,152 four-byte locations. In addition, pixel data is stored in blocks of 960 sequential four-byte locations, representing halves of horizontal rows. Accordingly, destination addresses 1315 and 1320 each have 21 bits, ranging from 0 to 2,097,151.

The low order bit of column counter 1310 (bit C0) is not used in destination addresses 1315 and 1320. As described above, pixel data for each of the pixels in a horizontal pixel pair is stored in a respective memory device at the same address and so the same address can be used to retrieve pixel data for either pixel. Referring to table 900 in FIG. 9, address 0 can be used to access pixel data for pixel 0 or for pixel 1. While column counter 1310 differentiates between pixels 0 and 1, destination addresses 1315 and 1320 do not. To access pixel data for pixel 0 or pixel 1, address 0 is supplied to first memory 810 or second memory 815, respectively. Accordingly, bit C0, the lowest order bit of column counter 1310, is not used in destination addresses 1315 and 1320. In an alternative implementation, destination addresses 1315 and 1320 include bit C0 of column counter 1310 (and so destination addresses 1315 and 1320 have 22 bits), but memories 810 and 815 ignore this bit and treat the upper 21 bits as the full address.

However, bit C0 can be used to indicate which column of pixels is being processed by video destination 825. For example, C0 is 0 for even-numbered columns (e.g., columns 0, 2, 4, etc.) and C0 is 1 for odd-numbered columns (e.g., columns 1, 3, 5, etc.). Accordingly, video destination 825 can use bit C0 to control second data switch 830. Because bit C0 changes with each new column, video destination 825 can use bit C0 to toggle a flip-flop to toggle the state of second data switch 830. For example, for the first column of pixels (column 0), C0 is 0 and so pixel data from first memory 810 is supplied to first destination input 827 and pixel data from second memory 815 is supplied to second destination input 829. Referring to table 900 in FIG. 9, video destination 825 would receive pixel data for vertical pixel pair 0-1920 from first and second memories 810 and 815, respectively. For the second column of pixels (column 1), C0 is 1 and the state of second data switch 830 changes. Pixel data from first memory 810 is supplied to second destination input 829 and pixel data from second memory 815 is supplied to first destination input 827. Referring to table 900 in FIG. 9, video destination 825 would receive pixel data for vertical pixel pair 1-1921 from second and first memories 815 and 810, respectively.

Figure 14:
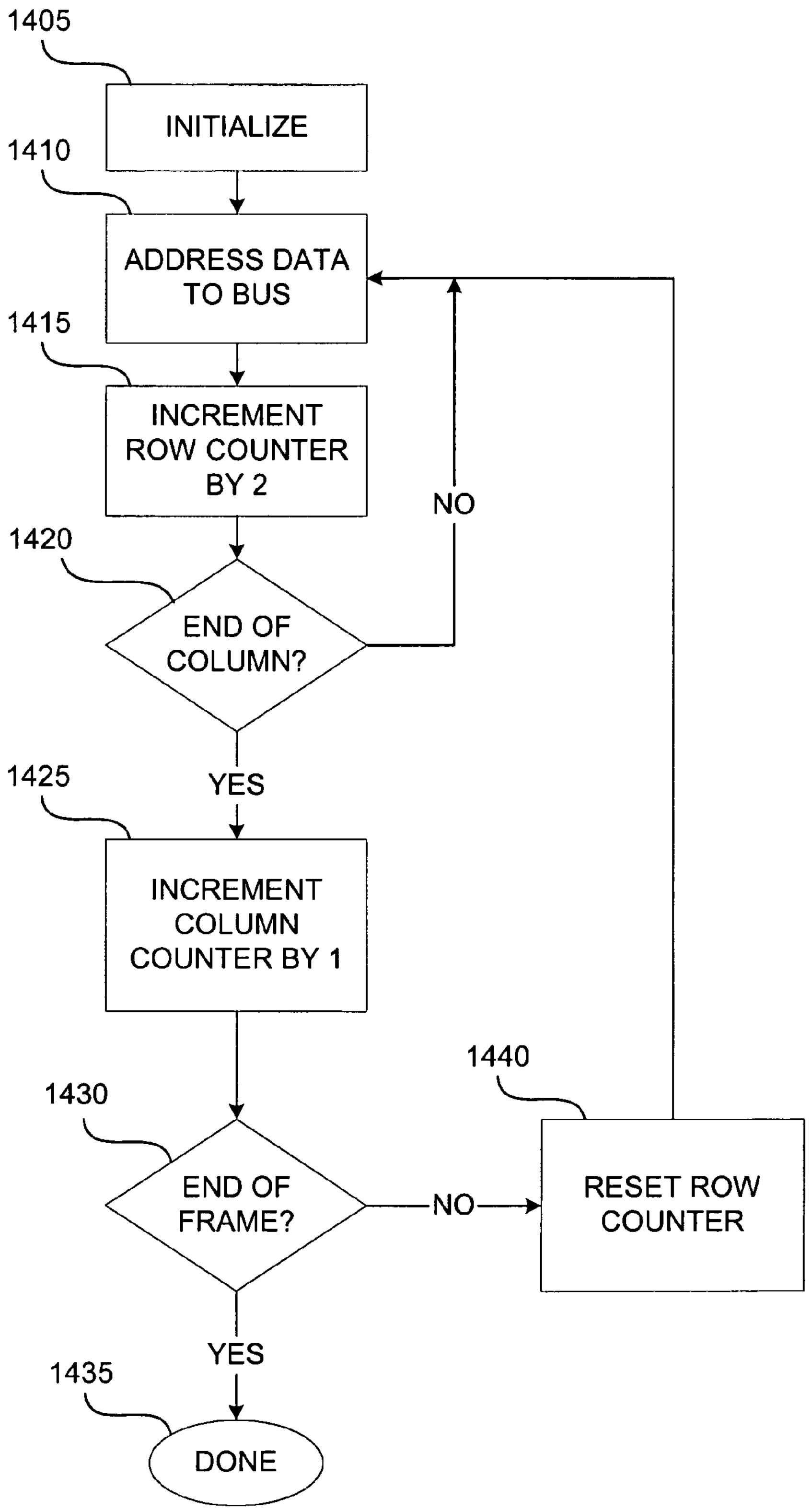
FIG. 14 is a flowchart of generating addresses for retrieving pixel data according to the present invention.

FIG. 14 is a flowchart of generating addresses for retrieving pixel data from a first memory for a frame of pixels in an HD resolution implementation using 1024 locations in each memory per row of pixels. At the beginning of a frame, video destination 825 resets row counter 1305 to 0 and column counter 1310 to 0, block 1405. Video destination 825 generates first destination address 1315 and second destination address 1320 as described above. Video destination 825 provides first destination address 1315 to first destination address bus 870 and second destination address 1320 to second destination address bus 880, block 1410. Video destination 825 increments row counter 1305 by 2, block 1415. Video destination 825 compares the value of row counter 1305 to a maximum row value (e.g., 1080) to check if the end of the vertical column has been reached, block 1420. If row counter 1305 is less than the maximum row value, video destination 825 proceeds to block 1410. If row counter 1305 is greater than or equal to the maximum row value, video destination 825 increments column counter 1310 by 1, block 1425. Video destination 825 compares the value of column counter 1310 to a maximum column value (e.g., 1920) to check if the end of the frame has been reached, block 1430. If the maximum column value has been reached, address generation for the current frame is complete, block 1435. If the maximum column value has not been reached, video destination 825 resets row counter 1305, block 1440, and proceeds to block 1410. At the beginning of each column, the first destination address is set to correspond to the pixel in alternately the first or second horizontal row, such as by setting the row counter to the value of bit C0 of column counter 1310. When retrieving pixel data for a new frame, video destination 825 starts generating addresses again beginning with block 1405.

In an alternative implementation, video destination 825 provides first destination address 1315 and second destination address 1320 to memories 810 and 815 in alternation with each column of pixels. At the beginning of each column, the row counter is reset to 0. Bit C0 can be used to control which destination address is sent to which destination address bus and so to which memory. For example, for pixels in the first column (and other even-numbered columns, where the first column is considered column 0), where C0 is 0, first memory 810 receives first destination address 1315 and retrieves pixel data for pixels in even-numbered rows. Second memory 815 receives second destination address 1320 and retrieves pixel data for pixels in odd-numbered rows. For pixels in the second column (and other odd-numbered columns), where C0 is 1, first memory 810 receives second destination address 1320 and retrieves pixel data for pixels in odd-numbered rows. Second memory 815 receives first destination address 1315 and retrieves pixel data for pixels in even-numbered rows. The alternation of destination addresses accommodates this retrieval pattern.

Figure 15:
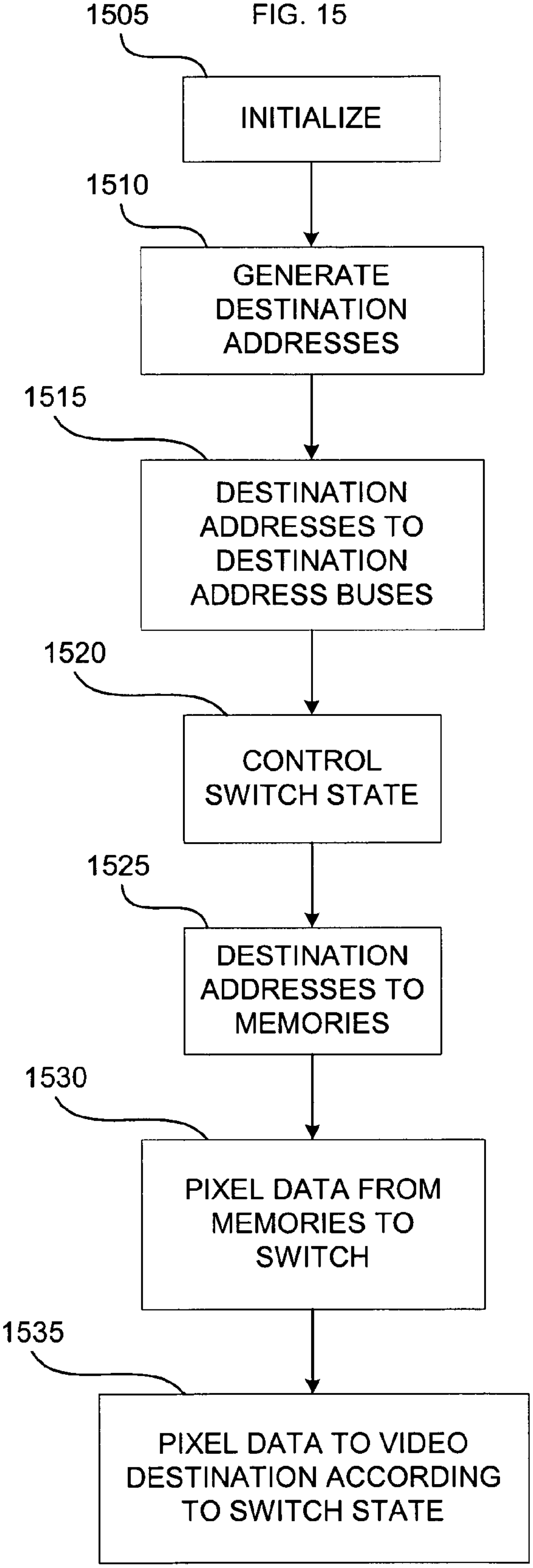
FIG. 15 is a flowchart of retrieving pixel data according to the present invention.

FIG. 15 is a flowchart of retrieving pixel data. To retrieve pixel data, memories 810 and 815 are put in read mode and address multiplexors 855 and 865 are set to connect second inputs 875 and 885 to outputs 890 and 895, respectively, block 1505. Video destination 825 generates first destination address 1315 and second destination address 1320, as described above, block 1510. Video destination 825 provides first and second destination addresses to first and second destination address buses 870 and 880, as described above, which in turn provide the destination addresses to address multiplexors 855 and 865, block 1515. Video destination 825 provides a control signal, as described above, to second data switch 830 for state control, block 1520. Alternatively, video destination 825 provides a control signal to second data switch 830 when the state of second data switch 830 is to change. First address multiplexor 855 provides the address from first destination address bus 870 to first memory 810 through output 890 and second address multiplexor 865 provides the address from second destination address bus 880 to second memory 815 through output 895, block 1525. First memory 810 provides pixel data stored at the received address to first data bus 835 and second memory 815 provides pixel data stored at the received address to second data bus 840, and data buses 835 and 840 provide the pixel data to second data switch 830, block 1530.

Second data switch 830 uses the control signal received from video destination 825 to control which pixel data to send to which destination input of video destination 825, block 1535. As described above, in one implementation, video destination 825 uses one of the counter bits for controlling second data switch 830, such as bit C0 of column counter 1310 in FIG. 13. When C0 is 0, indicating an even-numbered vertical column, second data switch 830 provides pixel data from first data bus 835 to first destination input 827 and pixel data from second data bus 840 to second destination input 829. When C0 is 1, indicating an odd-numbered vertical column, second data switch 830 provides pixel data from second data bus 840 to first destination input 827 and pixel data from first data bus 835 to second destination input 829. Two pixels have been retrieved in parallel from two memories using different addresses. Referring to FIGS. 6A, 6B, and 6C, pixel 0 and pixel 8 would be retrieved from first memory device 650 and second memory device 675, respectively, at the same time from addresses 0 and 4, respectively. To retrieve pixel data for the next two pixels, video destination 825 returns to block 1510, or to block 1505 to restore the state of architecture 800 for retrieval.

2. Checkerboard Frame Buffer Using Two Memory Devices, 960 Memory Locations Per Row of 1920 Pixels In another HD resolution implementation, rather than allocating 1024 memory locations in each memory device to each row of 1920 pixels (960 horizontal pixel pairs), the checkerboard frame buffer allocates 960 memory locations in each memory device to each row of 960 horizontal pixel pairs. This allocation creates fewer gaps in memory and so uses less memory for the same amount of pixel data. The structure and operation of this implementation is similar to architecture 800 in FIG. 8, as described above, however, address generation is different, as described below. In implementations for different screen resolutions, the checkerboard buffer can allocate in each memory device a number of memory locations for each row of pixels equal to half the number of pixels in a row.

FIG. 16 is a table 1600 of addresses 1605 and pixel numbers 1610 for storing a 1920×1080 frame of pixel data. Similar to table 900 in FIG. 9, pixel numbers 1610 indicate for each address 1605 in two memories (e.g., memories 810 and 815 in FIG. 8) the pixel for which pixel data is stored at that address 1605 in each memory. FIG. 16 shows only a small number of addresses for illustration. Ellipses indicate intervening addresses or data.

960 memory locations are allocated in each memory device to each row of 1920 pixels. For example, pixel data for pixel 0 is stored at address 0 in first memory 810 and pixel data for pixel 1 is stored at address 0 in second memory 815. Pixel data for horizontal pixel pair 1918-1919 (i.e., the last two pixels of the first horizontal row) is stored at address 959 in first memory 810 and second memory 815, respectively. In the next horizontal row of pixels, pixel data for pixel-pair 1920-1921 is stored at address 960 in second memory 815 and first memory 810, respectively. In contrast with table 900, in table 1600, there are no unused addresses between the address storing pixel data for the pixel at the end of a horizontal row and the address storing pixel data for the pixel at the beginning of the next row in a frame.

As described above, video source 805 generates addresses to store pixel data for horizontal pixel pairs according to horizontal rows of pixels, however, in this implementation, the sequence of addresses is different from the sequence described above. Video source 805 stores pixel data for pixel pairs in this sequence: 0-1, 2-3, 4-5, and so on. Referring to FIG. 16, video source 805 generates addresses in the following sequence (one address for each pixel pair): 0, 1, 2, . . . , 959, 960, 961, and so on.

Video source 805 uses a counter to generate source addresses. The counter ranges from 0 to one less than one-half of the numbers of pixels in one frame (recalling that each memory stores pixel data for half the pixels in one frame; (1920*1080/2)−1=1,036,799). Video source 805 generates addresses following a similar process as shown in FIG. 11, however, video source 805 does not cause the counter to increment by 64 at the end of each row, and instead proceeds with the next sequential address (e.g., from 959 to 960, rather than from 959 to 1024).

As described above, video source 805 also sends a control signal to first data switch 820 for state control. Video source 805 causes the state to change at the end of each horizontal row, such as by toggling a flip-flop based on the horizontal synchronization signal or when the counter reaches a multiple of 960.

Similar to the destination address generation described above, in this implementation, video destination 825 generates addresses to retrieve pixel data for vertical pixel pairs according to vertical columns of pixels, however, the sequence of addresses is different from the sequence described above. Video destination 825 retrieves pixel data for vertical pixel pairs in this sequence: 0-1920, 3840-5760, . . . , 1-1921, 3841-5761, and so on. Referring to FIG. 16, video destination 825 generates addresses in the following sequence: 0-960, 1920-2880, . . . , 0-960, 1920-2880, . . . , 1-961, 1921-2881, and so on. As described above, the same sequence of addresses can be used for two columns of pixels, however, which memory receives which address changes with each column. In the first column, first memory 810 receives the first address in the pair of addresses, and in the second column, first memory 810 receives the second address. For example, for the first vertical pixel pair in the first column, first memory 810 receives address 0 (pixel 0) and second memory 815 receives address 960 (pixel 1920). For the first vertical pixel pair in the second column, first memory 810 receives address 960 (pixel 1921) and second memory 815 receives address 0 (pixel 1).

Various implementations can be used to generate the destination addresses. In one implementation, video destination 825 also uses a counter ranging from 0 to one less than one-half of the numbers of pixels in one frame to generate destination addresses. The counter increments by the number of pixels in a horizontal row (i.e., the width), such as 1920 in a HD resolution implementation. The first destination address would be the value of the address counter. The second destination address would be equal to the first destination address plus 960 for even-numbered columns and equal to the first destination address minus 960 for odd-numbered columns. In this implementation, first memory 810 always receives the first destination address and second memory 815 always receives the second destination address. The counter is incremented after each vertical pixel pair (e.g., referring to FIG. 6B, to access pixel data for pixel pair 0 and 8, and then for pixel pair 16 and 24, both in the first column). At the beginning of each new column of pixels, the counter is reset to 0 (for even columns) or 960 (for odd columns) plus a value equal to half of the number of columns of pixels completed. For example, using a separate column counter to count columns, the address counter can be reset to a value derived by dividing the number of columns completed by 2 and adding the quotient to the remainder times 960. This address counter would be reset in this sequence: 0, 960, 1, 961, and so on. The last pixel pair of a column is indicated by the counter meeting or exceeding a threshold, such as the address of the first pixel pair in the next to last horizontal row (e.g., 1078*960=1,034,880). In addition, at the beginning of each column, video destination 825 toggles the state of second data switch 830.

In another implementation, one memory device receives the value of the counter as an address, and one memory device receives the value of the counter plus half the width (e.g., 960). Which memory device receives the value of the counter and which receives the value of the counter plus half the width alternates with each column of pixels. For example, referring to FIGS. 6A, 6B, and 6C, for the first pixel pair, first memory device 650 would receive address 0 (the value of the counter; pixel 0) and second memory device 675 would receive address 4 (the value of the counter plus 4; pixel 8). The counter would be incremented by the width to 8. For the next pixel pair, first memory device 650 would receive address 8 (pixel 16) and second memory device 675 would receive address 12 (pixel 24). For the next column, the counter would be reset to 0. Second memory device 675 would receive address 0 (the value of the counter; pixel 1) and first memory device 650 would receive address 4 (the value of the counter plus 4; pixel 9). The counter would be incremented to 8. For the next pixel pair, second memory device 675 would receive address 8 (pixel 17) and first memory device 650 would receive address 12 (pixel 25). For the third column, the counter would be reset to 1. First memory device 650 would receive addresses 1 and 9 (pixels 2 and 18) and second memory device 675 would receive addresses 5 and 13 (pixels 10 and 26). This pattern continues throughout the remainder of the frame.

In another implementation, destination addresses are mathematically derived from a row counter and a column counter, such as by multiplying the row counter value by half of the width of a frame and adding the column counter value. In yet another implementation, a row counter and a column counter can be used as indices into a look-up table of destination addresses.

3. Checkerboard Frame Buffer Using Two Memory Devices and Memory Sections

In another implementation, the memory address space is divided into two sections. This division applies to both memory devices. As described above referring to double-buffering, one section of each memory is used for storing pixel data and the other section for retrieving pixel data. The sections switch roles with each frame. The operation of architecture 800 of FIG. 8 modified to use memory sections is described below.

Memories 810 and 815 each store pixel data for complementary halves of two frames at a time. Memories 810 and 815 are divided in half. For example, where memories 810 and 815 are 32-bit wide 8 MB SDRAM's, a first section of addresses (0 through 1,048,575) is for one frame and a second section of addresses (1,048,576 through 2,097,151) is for another frame. As described above, in HD resolution, half of one frame has 1,036,800 pixels and so a 32-bit wide 8 MB SDRAM is sufficiently large for half of each of two frames. However, where 1024 32-bit locations are used for pixel data for each row of pixels, half of each of two frames does not fit into a 32-bit 8 MB SDRAM, and so either 960 32-bit locations for each row would be used or a larger memory (e.g., 16 MB) would be required. While one frame is being stored in one section, another frame is being retrieved from the other section, such as in alternating series of read and write operations. After processing these frames has completed, pixel data for a new frame is read into the section storing the frame just read out, and pixel data for the frame just stored is read out. In this way, the sections alternate between reading and writing. To generate addresses for storing pixels, video source 805 alternates between initializing the counter to 0 and to the middle of the available address space (e.g., 1,048,576) with each frame to alternate between the two sections of memory. Similarly, video destination 825 alternates between resetting its counter to 0 and the middle of the available address space with each frame to be retrieved.

In addition, pixel data can be stored and retrieved in alternation for blocks of pixels smaller than an entire frame. For example, in one implementation, video source 805 and video destination 825 each include a FIFO buffer. As video source 805 receives pixel data, video source 805 fills its FIFO buffer. At regular intervals, such as when the FIFO buffer is full or after pixel data for a number of pixels has been placed in the FIFO buffer, video source 805 causes pixel data for a block of pixels from its FIFO buffer, such as the first 32 pixels in the FIFO buffer, to be stored and generates the appropriate addresses for a series of write operations. After this block has been stored video source 805 passes control to video destination 825. Video destination 825 generates addresses, retrieves pixel data for a block of pixels, such as 32 pixels, in a series of read operations from memories 810 and 815, and stores the pixel data in its own FIFO buffer. Video destination 825 then passes control back to video source 805, and so on. Video source 805 and video destination 825 preserve the counter values between blocks to accommodate this block-based processing.

Figure 17:
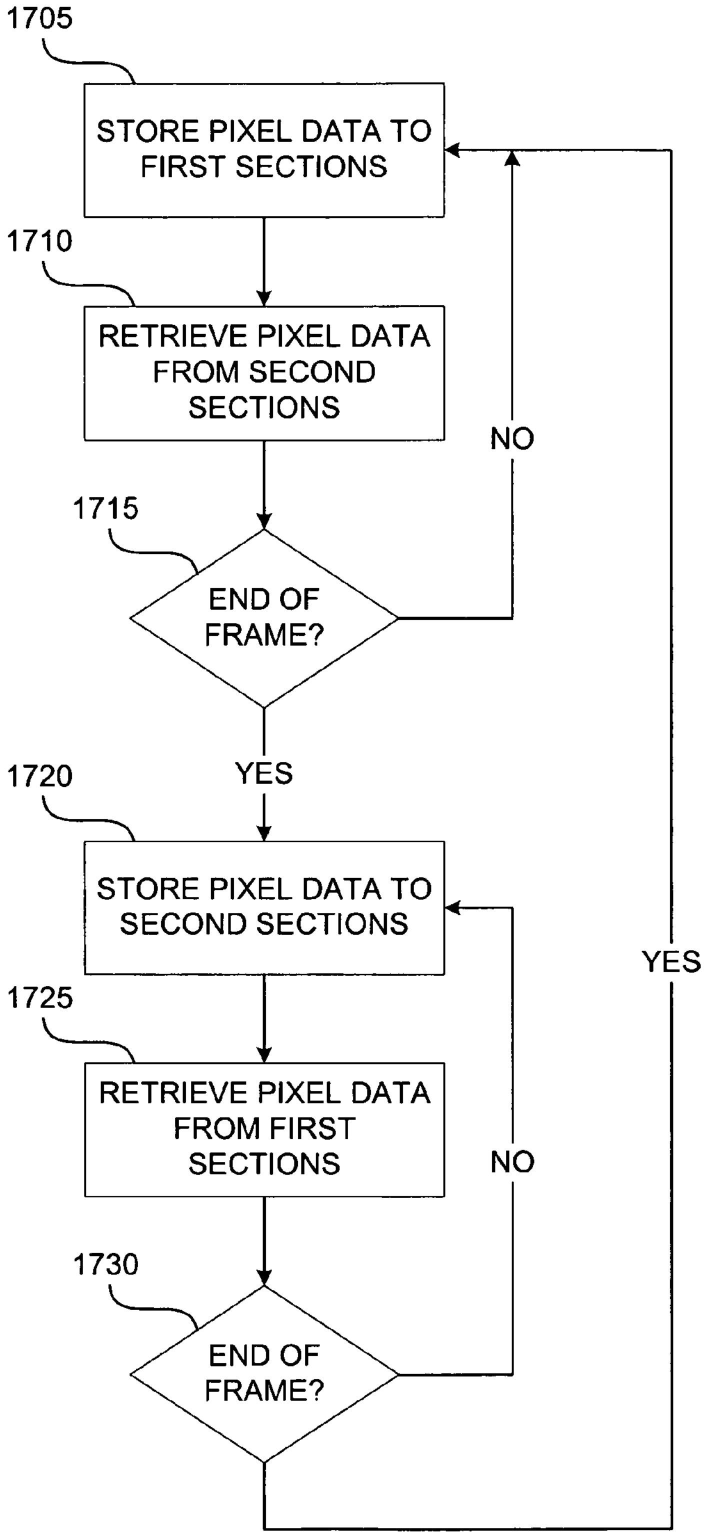
FIG. 17 is a flowchart of reading and writing blocks of pixels using memory sections according to the present invention.

FIG. 17 is a flowchart of reading and writing blocks of pixels using memory sections. When video source 805 has received pixel data for a block of pixels from a first frame, such as 32 pixels, video source 805 stores the pixel data in the first sections (e.g., starting from address 0) of memories 810 and 815 in a series of write operations, block 1705. Video destination 825 takes control (or video source 805 passes control to video destination 825) and retrieves pixel data for a block of pixels from a previous frame, such as 32 pixels, from the second sections (e.g., starting from the middle of the memory address space, such as 1,048,576) of memories 810 and 815, block 1710. Initially, while the very first frame is being stored to the first sections, the second sections will have undefined data and so pixel data retrieved from the second sections during this first iteration will most likely not produce a valid image, but this situation will only last while the first frame is being stored. Video source 805 takes control (or video destination 825 passes control to video source 805) and checks whether the end of the frame being stored has been reached, block 1715. If the end of the frame has not been reached, video source 805 returns to block 1705 and stores pixel data for the next block of pixels in the first sections of memories 810 and 815. If the end of the frame has been reached, video source 805 stores pixel data for the next block of pixels from the next frame in the second sections of memories 810 and 815, block 1720. Video destination 825 takes control and retrieves pixel data for a block of pixels from the first sections of memories 810 and 815, block 1725. Video source 905 takes control and checks whether the end of the frame being stored has been reached, block 1730. If the end of the frame has not been reached, video source 805 returns to block 1720 and stores pixel data for the next block of pixels in the second sections of memories 810 and 815. If the end of the frame has been reached, video source 805 returns to block 1705 and stores pixel data for the first block of pixels from the next frame in the first sections of memories 810 and 815. This alternation continues until video source 805 does not receive pixel data.

4. Checkerboard Frame Buffers Using Two Memory Devices and a Memory Controller

As described above, architecture 800 controls addressing and data flow using video source 805, video destination 825, first and second data switches 820 and 830, and address multiplexors 855 and 865. A memory controller can be used to control addressing and data flow to and from the memory devices of a checkerboard buffer.

Figure 18:
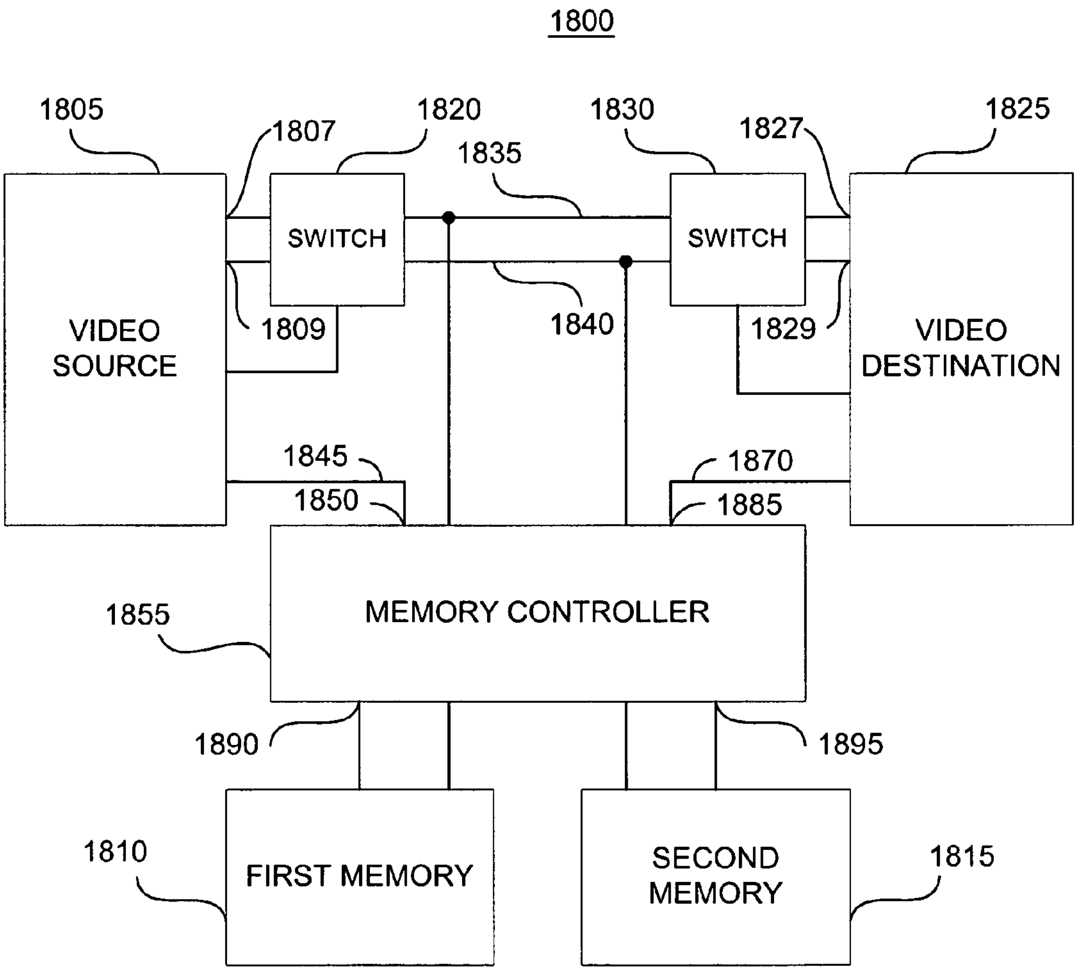
FIG. 18 is a block diagram of an implementation of a switching dual pixel frame buffer architecture having a memory controller according to the present invention.

FIG. 18 is a block diagram of another implementation of a switching dual pixel frame buffer architecture 1800. Architecture 1800 is similar to architecture 800 of FIG. 8, but a memory controller 1855 provides data and addresses to memories 1810 and 1815. Memory controller 1855 receives pixel data from video source 1805 to store in memories 1810 and 1815. Memory controller 1855 retrieves pixel data from memories 1810 and 1815 and provides the pixel data to video destination 1825. Memory controller 1855 replaces address multiplexors 855 and 865 in FIG. 8. Memory controller 1855 receives signals from video source 1805 and video destination 1825 through control lines 1845 and 1870, respectively, indicating whether pixel data is to be stored to or retrieved from memories 1810 and 1815. Memory controller 1855 generates addresses and supplies these addresses along with control signals to memories 1810 and 1815. Accordingly, memory controller 1855 controls address generation rather than video source 1805 and video destination 1825, as compared with architecture 800 of FIG. 8. In addition, as noted above with respect to FIG. 8, architecture 1800 operates based on clock cycles so that pixel data can be processed for two pixels per clock cycle in support of the desired pixel rate. In an alternative implementation, memory controller 1855 also controls the states of data switches 1820 and 1830, rather than video source 1805 and video destination 1825 as in FIG. 8.

Figure 19:
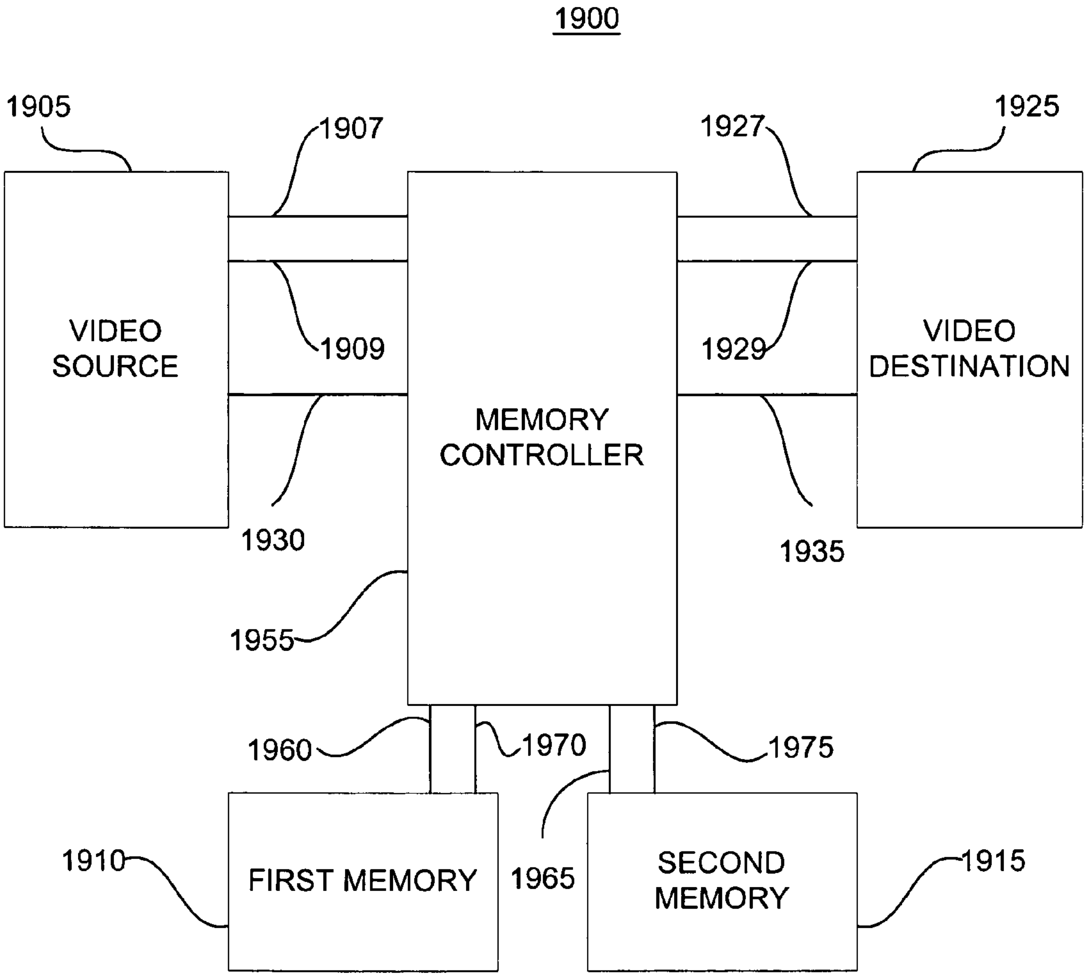
FIG. 19 is a block diagram of another implementation of a switching dual pixel frame buffer architecture having a memory controller according to the present invention.

FIG. 19 is a block diagram of another implementation of a switching dual pixel frame buffer architecture 1900. Architecture 1900 is similar to architecture 1800 of FIG. 18, but a memory controller 1955 includes data switch functionality and so replaces data switches 1820 and 1830 in FIG. 18. Memory controller 1955 receives pixel data from video source 1905 through data buses 1907 and 1909 to store in memories 1910 and 1915. Memory controller provides pixel data to video destination 1925 through data buses 1927 and 1929 retrieved from memories 1910 and 1915. Each data bus provides pixel data for one pixel at a time, as in architecture 800 of FIG. 8 or architecture 1800 of FIG. 18. Memory controller 1955 receives signals from video source 1905 and video destination 1925 through control lines 1930 and 1935, respectively, indicating whether pixel data is to be stored to or retrieved from memories 1910 and 1915. Memory controller 1955 generates addresses and supplies these addresses along with control signals to memories 1910 and 1915 through address buses 1960 and 1965, respectively. When storing pixel data, memory controller 1955 provides pixel data to memories 1910 and 1915 through data buses 1970 and 1975, respectively. When retrieving pixel data, memory controller 1955 receives pixel data from memories 1910 and 1915 through data buses 1970 and 1975, respectively. Accordingly, memory controller 1955 controls address generation and where pixel data for each pixel is sent (similar to data switches 820 and 830 of FIG. 8). In addition, as noted above with respect to FIG. 8, architecture 1900 operates based on clock cycles so that pixel data can be processed for two pixels per clock cycle in support of the desired pixel rate.

5. Checkerboard Frame Buffer Using Four Memory Devices

Increasing from one memory device to two memory devices in a frame buffer can provide an improvement in memory bandwidth. Similarly, increasing from the two memory devices of architecture 800 in FIG. 8 to four memory devices can provide a further increase in bandwidth.

Figure 20:
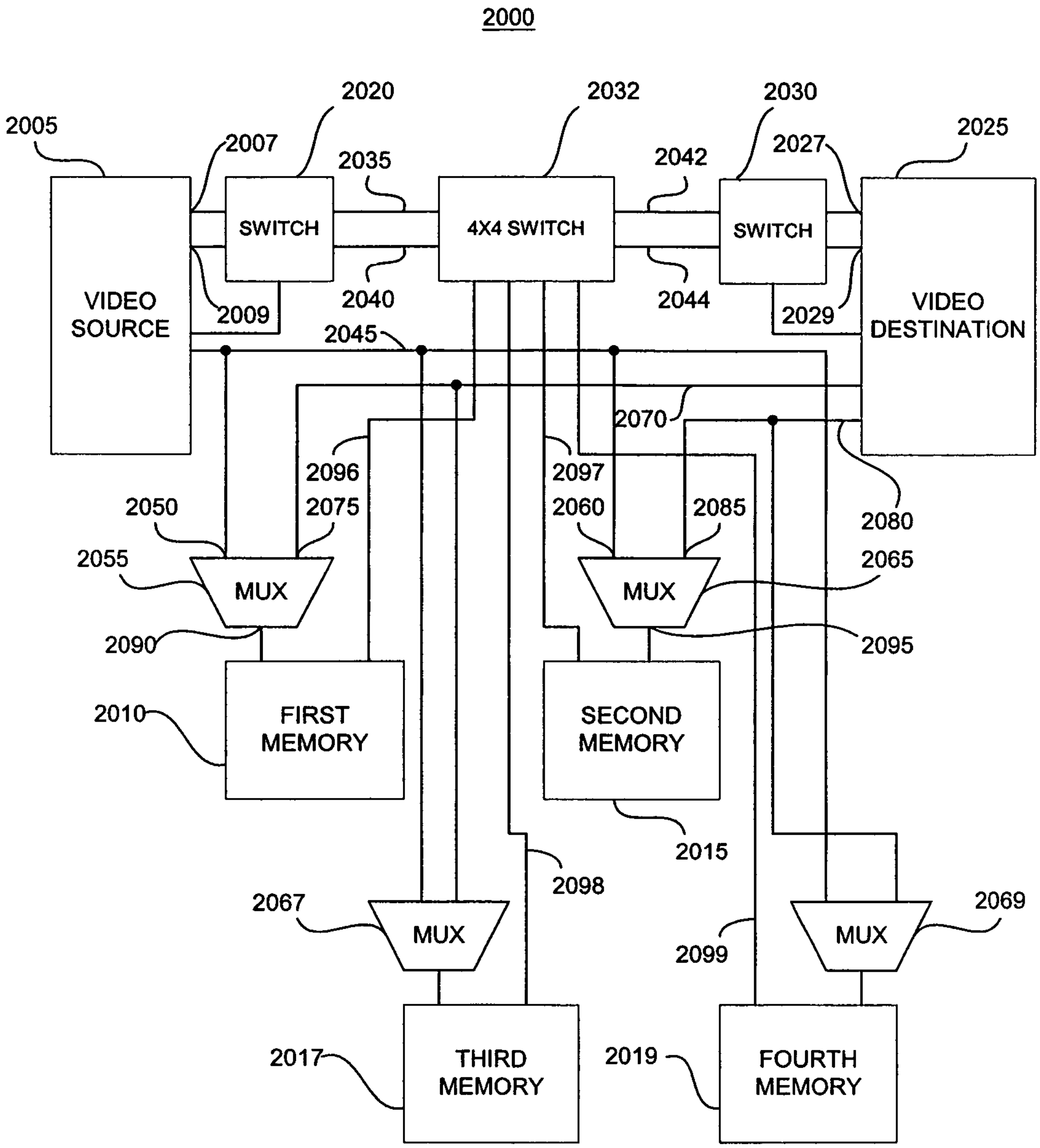
FIG. 20 is a block diagram of a switching dual pixel frame buffer architecture having four memory devices according to the present invention.

FIG. 20 is a block diagram of a switching dual pixel frame buffer architecture 2000 having four memory devices: first memory 2010, second memory 2015, third memory 2017, and fourth memory 2019. The memory devices are used in two alternating banks for storing and retrieving pixel data a frame at a time. For example, a first frame of pixel data is stored, two pixels at a time, in first memory 2010 and second memory 2015, such as described in FIG. 12. A second frame of pixel data is then stored in third memory 2017 and fourth memory 2019. While the second frame is being stored, the first frame of pixel data is retrieved from first memory 2010 and second memory 2015, two pixels at a time, such as described in FIG. 15. Accordingly, pixel data for the first frame is retrieved at the same time pixel data for the second frame is stored (i.e., during the same clock cycle). During every clock cycle, pixel data for one frame is stored and pixel data previously stored is retrieved. For the next frames, the memory banks are switched. The third frame of pixel data is stored in first memory 2010 and second memory 2015, while the second frame pixel data is retrieved from third memory 2017 and fourth memory 2019. This alternation between memory banks continues as long as frames are supplied to video source 2005. Because of the increased memory size and simultaneous storage and retrieval, an HD resolution implementation of architecture 2000 using four 32-bit wide 8 MB SDRAM's can be implemented allocating 1024 locations in each memory to each row of pixels and without internally dividing each of the memory devices into sections.

Architecture 2000 is similar to architecture 800 in FIG. 8, except that architecture 2000 has additional hardware to support switching between the two banks of memory devices: a 4×4 data switch 2032, and two additional address multiplexors 2067 and 2069. 4×4 switch 2032 is connected to memories 2010, 2015, 2017, and 2019 by memory buses 2096, 2097, 2098, and 2099, respectively. 4×4 data switch 2032 has two states: (A) connecting data buses 2035 and 2040 to memories 2010 and 2015, respectively, and data buses 2042 and 2044 to memories 2017 and 2019, respectively; and (B) connecting data buses 2035 and 2040 to memories 2017 and 2019, respectively, and data buses 2042 and 2044 to memories 2010 and 2015, respectively. Accordingly, in state A while memory buses 2096 and 2097 are providing pixel data to be stored to first memory 2010 and second memory 2015, respectively, memory buses 2098 and 2099 are providing pixel data retrieved from third memory 2017 and fourth memory 2019, respectively. Conversely, in state B while memory buses 2096 and 2097 are providing pixel data retrieved from first memory 2010 and second memory 2015, respectively, memory buses 2098 and 2099 are providing pixel data to be stored to third memory 2017 and fourth memory 2019, respectively. 4×4 switch 2032 receives a control signal (not shown) to switch between states, such as from video source 2005. Video source 2005 toggles the control signal after completing storing pixel data for a frame. In one implementation, 4×4 switch 2032 is connected to a flip-flop that is triggered by a vertical synchronization signal supplied by video source 2005. Third address multiplexor 2067 and fourth address multiplexor 2069 are used in the same manner as first address multiplexor 2055 and second address multiplexor 2065, as described above referring to address multiplexors 855 and 865 in FIGS. 8, 12, and 15. In addition, while clock lines are not shown in FIG. 20, architecture 2000 operates based on clock cycles so that pixel data can be processed for two pixels per clock cycle in support of the desired pixel rate.

Figure 21:
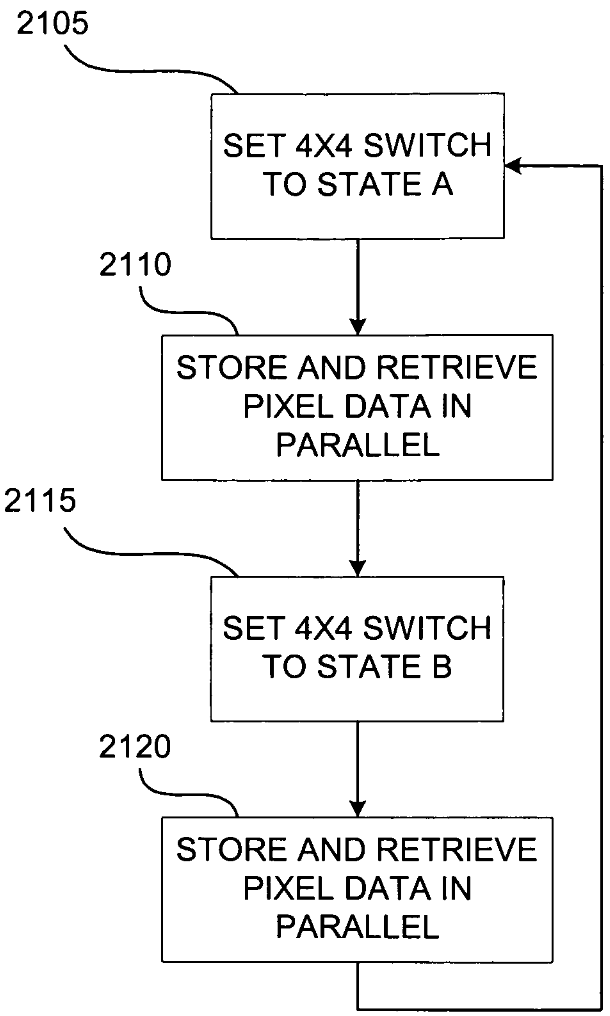
FIG. 21 is a flowchart of storing and retrieving pixel data in parallel according to the present invention.

FIG. 21 is a flowchart of storing and retrieving pixel data in parallel in architecture 2000 of FIG. 20. When a first frame of pixel data becomes available to video source 2005, video source 2005 sets 4×4 switch 2032 to state A (pixel data to be stored to first memory 2010 and second memory 2015, pixel data to be retrieved from third memory 2017 and fourth memory 2019), block 2105. Video source 2005 stores the first frame of pixel data, two pixels at a time, in first memory 2010 and second memory 2015, as described above referring to FIGS. 10, 11, and 12, and video destination 2025 retrieves pixel data from third memory 2017 and fourth memory 2019, as described above referring to FIGS. 13, 14, and 15, block 2110. Initially, valid pixel data has not been stored in memories 2017 and 2019, and so pixel data retrieved during the first loop will not produce a valid image. After a frame of pixel data has been stored, video source 2005 sets 4×4 switch 2032 to state B (pixel data to be retrieved from first memory 2010 and second memory 2015, pixel data to be stored to third memory 2017 and fourth memory 2019), block 2115. A frame of pixel data is stored by video source 2005 and another frame is retrieved by video destination 2025 according to the state of 4×4 switch 2032, as described above, block 2120. After a frame of pixel data has been stored, video source 2005 returns to block 2105 and sets 4×4 switch 2032 to state A. When a new frame is not available to video source 2005, storing and retrieving pixels from architecture 2000 is complete. When a new frame later becomes available, video source 2005 begins at block 2105 again.

6. Checkerboard Frame Buffers Using Four Memory Devices and a Memory Controller

Similar to the implementations described above referring to FIGS. 18 and 19, in alternative four memory device implementations a memory controller can control addressing, replacing address multiplexors 2055, 2065, 2067, and 2069, or can also replace switches 2020, 2030, and 2032. Similarly, in another implementation, a pair of memory controllers can be used to replace pairs of address multiplexors 2055, 2065 and 2067, 2069. These alternative implementations would have architectures modified from architecture 2000 in similar ways to how architecture 800 can be modified to form architectures 1800 and 1900, as described above referring to FIGS. 8, 18, and 19.

Figure 22:
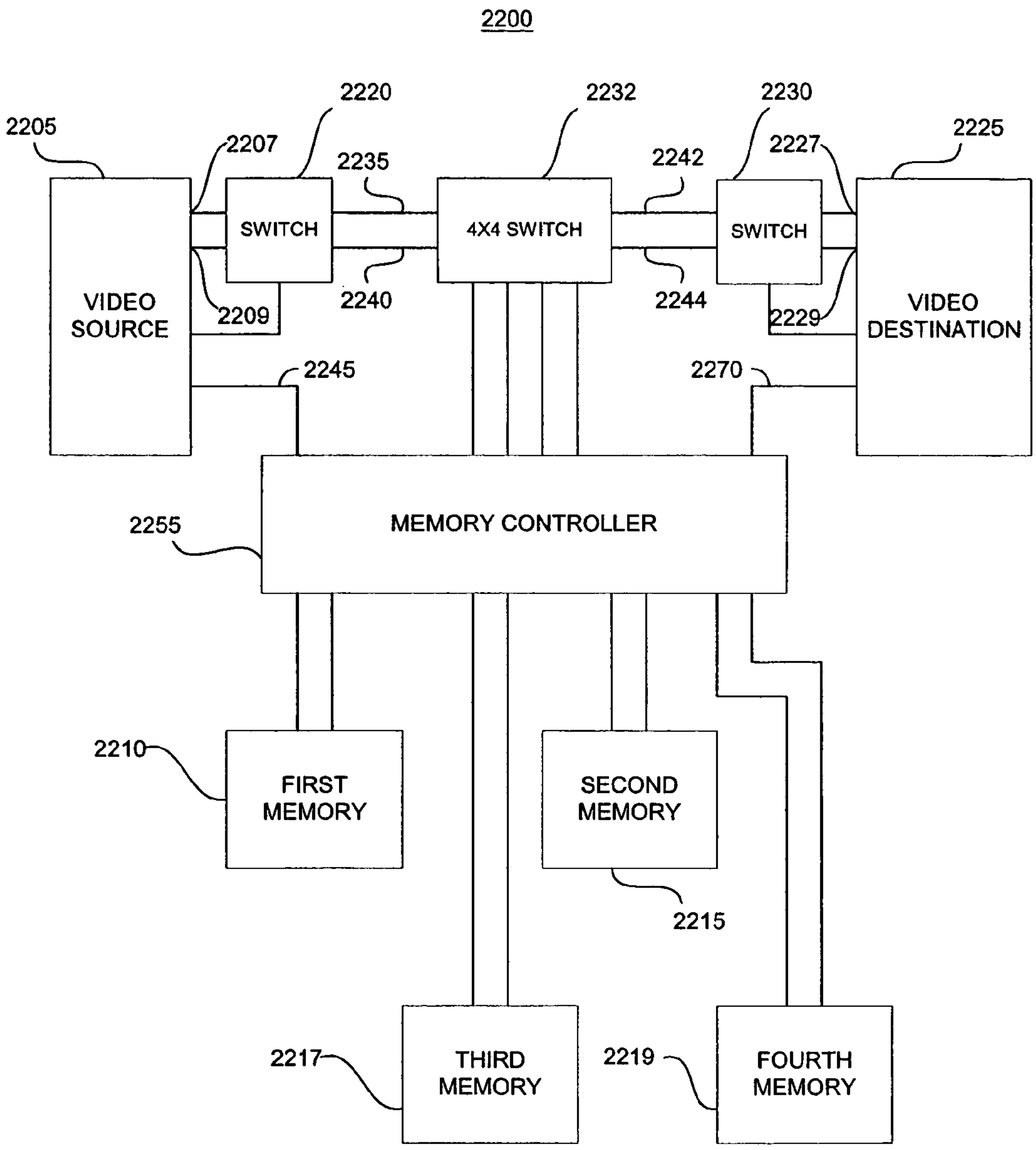
FIG. 22 is a block diagram of one implementation of a switching dual pixel frame buffer architecture having four memory devices and a memory controller according to the present invention.

FIG. 22 is a block diagram of one implementation of a switching dual pixel frame buffer architecture 2200 having four memory devices and a memory controller 2255 providing data and addresses to memories 2210, 2215, 2217, and 2219. Memory controller 2255 replaces address multiplexors 2055, 2065, 2067, and 2069 in architecture 2000 of FIG. 20.

Figure 23:
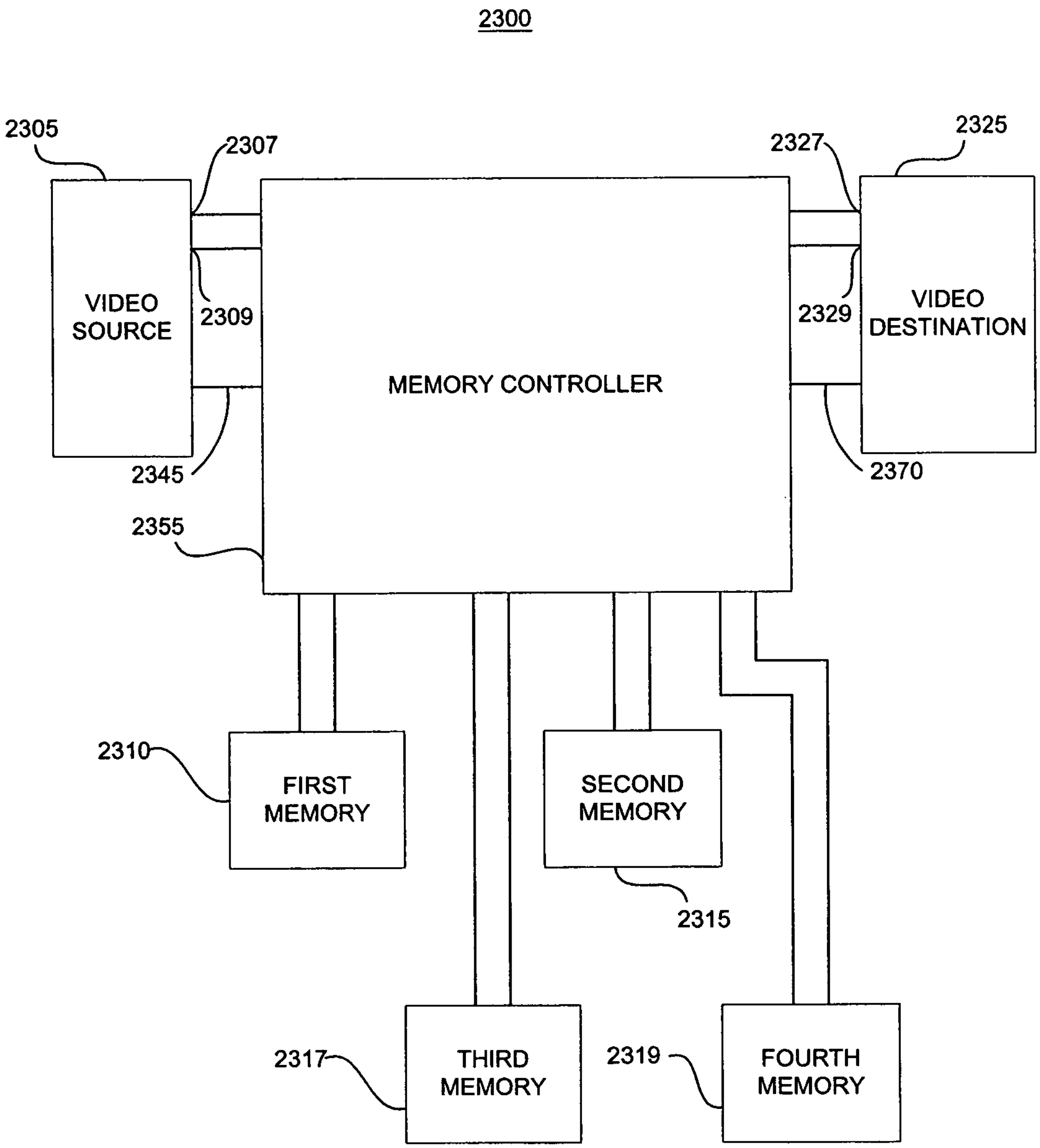
FIG. 23 is a block diagram of another implementation of a switching dual pixel frame buffer architecture having four memory devices and a memory controller according to the present invention.

FIG. 23 is a block diagram of another implementation of a switching dual pixel frame buffer architecture 2300 having four memory devices and a memory controller 2355 providing data and addresses to memories 2310, 2315, 2317, and 2319. Memory controller 2355 replaces address multiplexors 2055, 2065, 2067, and 2069, and switches 2020, 2030, and 2032 in architecture 2000 of FIG. 20.

7. Checkerboard Buffer Using Alternating Sweeping

Returning to FIG. 7, in an alternative implementation, data destination 715 is a GLV system that displays one column at a time, sweeping from left to right and right to left alternately with each frame projected. In this case, the address generation for retrieving pixel data from memory used in the video destination or memory controller (such as video destination 825 in FIG. 8, or memory controller 2355 in FIG. 23) is modified. Based on the counter systems described above, when scanning left to right in HD resolution, the column counter increments from 0 to 1919 (or 0 to 959 if counting memory location columns rather than screen columns). When scanning from right to left the column counters decrement from 1919 to 0 (or 959 to 0). The video destination uses the row counters in the same way as described above. The counter system of the video source for storing pixels is also unchanged.

8. Checkerboard Buffer Having Different Input and Output Data Rates

The rates at which pixels are stored and retrieved are different in some implementations. For example, in one implementation, video source 805 stores pixel data for 32-pixel blocks and video destination 825 retrieves pixel data for 64-pixel blocks. In this case, video destination 825 causes a frame to be displayed twice. Video destination 825 retrieves pixel data for an entire frame in the same time that video source 805 has provided half of the pixel data for a new frame. Video destination 825 then retrieves pixel data for the same frame again while video source 805 provides pixel data for the second half of the new frame. In one HD resolution implementation, the input pixel rate would be 150 MP/S and the output pixel rate would be 300 MP/S, for a total of 450 MP/S. Accordingly, a four memory device architecture, such as architecture 2000 in FIG. 20, can be used, such as with four 150 MHZ or faster SDRAM's.

Various illustrative implementations of the present invention have been described. The above description focuses on HD resolution video data displayed using a GLV system, but the methods and apparatus can be applied to different resolutions and different devices. Similarly, the pixel data for a pixel is described above as being 32 bits, but different depths are also possible with modification to the size of the addressed memory locations. The present invention can be implemented in electronic circuitry, computer hardware, software, or in combinations of them. For example, a checkerboard buffer can be implemented in various ways, such as with an FPGA, a hardwired design, a microprocessor architecture, or a combination. However, one of ordinary skill in the art will see that additional implementations are also possible and within the scope of the present invention. Accordingly, the present invention is not limited to only those implementations described above.

What is claimed is:

1. A checkerboard buffer, comprising:

a data source, providing data in pairs in a first order;

a data destination, receiving data in a second order;

at least two memory devices, each memory device having a plurality of memory locations, where data is stored in parallel to the memory devices and retrieved in parallel from the memory devices;

a first data switch coupled to the data source and each of the memory devices, where the first data switch controls which data of the pairs is stored to which memory device, wherein the first data switch is configured to swap which data of the pairs is stored in which of the memory devices; and a second data switch coupled to the data destination and each of the memory devices, where the second data switch controls providing data to the data destination according to the second order.

2. The checkerboard buffer of claim 1, where:

the checkerboard buffer is a frame buffer for storing a frame of pixels, the frame having horizontal rows of pixels and vertical columns of pixels;

the pixels are numbered from left to right, top to bottom, starting from 0 in the upper left corner;

the rows are numbered from top to bottom, starting from 0 at the top; and the columns are numbered from left to right, starting from 0 at the left.

3. The checkerboard buffer of claim 2, where:

the data is pixel data;

each pixel in the frame has corresponding pixel data;

pixel data for each pixel is stored in a respective memory location in a memory device; and pixel data stored in parallel is stored at the same address in each memory device.

4. The checkerboard buffer of claim 3, where the pixel data is provided according to a high definition screen resolution of 1920 columns of pixels and 1080 rows of pixels per frame.

5. The checkerboard buffer of claim 4, where data is provided by the data source at a rate of 600 megabytes per second.

6. The checkerboard buffer of claim 4, where data is received by the data destination at a rate of 600 megabytes per second.

7. The checkerboard buffer of claim 4, where the data source provides pixel data according to a progressive signal.

8. The checkerboard buffer of claim 3, where each pixel has 32 bits of pixel data.

9. The checkerboard buffer of claim 3, where pixel data for two pixels is stored in parallel in one clock cycle, pixel data for one pixel to one memory device and pixel data for the other pixel to another memory device.

10. The checkerboard buffer of claim 3, where pixel data for two pixels is retrieved in parallel in one clock cycle, pixel data for one pixel from one memory device and pixel data for the other pixel from another memory device.

11. The checkerboard buffer of claim 3, where pixel data is stored according to horizontal rows of pixels in the frame.

12. The checkerboard buffer of claim 11, where which memory stores pixel data for which pixel swaps with each horizontal row.

13. The checkerboard buffer of claim 3, where:

pixel data for even-numbered pixels in even-numbered rows is stored in a first memory device;

pixel data for odd-numbered pixels in even-numbered rows is stored in a second memory device;

pixel data for even-numbered pixels in odd-numbered rows is stored in the second memory device; and pixel data for odd-numbered pixels in odd-numbered rows is stored in the first memory device.

14. The checkerboard buffer of claim 3, where pixel data is stored according to horizontal pixel pairs.

15. The checkerboard buffer of claim 14, where the pixel data for each pixel of a horizontal pixel pair is stored at the same address in each of two memory devices.

16. The checkerboard buffer of claim 3, where pixel data is retrieved according to vertical columns of pixels in the frame.

17. The checkerboard buffer of claim 16, where the order that pixel data from two memory devices is provided to the data destination swaps with each vertical column.

18. The checkerboard buffer of claim 3, where pixel data is retrieved according to vertical pixel pairs.

19. The checkerboard buffer of claim 18, where the pixel data for each pixel of a vertical pixel pair is stored at a different address in each of two memory devices.

20. The checkerboard buffer of claim 3, where the first data switch swaps which memory device to store pixel data for two pixels with each horizontal row of pixels.

21. The checkerboard buffer of claim 20, where the first data switch swaps which memory device to store pixel data for two pixels based on an address of a memory location to store the pixel data.

22. The checkerboard buffer of claim 20, where the first data switch swaps which memory device to store pixel data for two pixels based on a counter reaching a multiple of the number of pixels in a horizontal row.

23. The checkerboard buffer of claim 20, where the first data switch swaps which memory device to store pixel data for two pixels based on a horizontal synchronization signal.

24. The checkerboard buffer of claim 20, where the first data switch swaps which memory device to store pixel data for two pixels in response to a flip-flop being toggled.

25. The checkerboard buffer of claim 3, where the second data switch swaps the order pixel data from each of two memory devices is provided to the data destination with each vertical column of pixels.

26. The checkerboard buffer of claim 25, where the second data switch swaps the order pixel data from each of two memory devices is provided based on an address of a memory location from which to retrieve pixel data.

27. The checkerboard buffer of claim 25, where the second data switch swaps the order pixel data from each of two memory devices is provided based on a counter reaching a maximum row value, indicating the last row in a column.

28. The checkerboard buffer of claim 27, where the maximum row value is 1080.

29. The checkerboard buffer of claim 25, where the second data switch swaps the order pixel data from each of two memory devices is provided in response to a flip-flop being toggled.

30. The checkerboard buffer of claim 29, where the memory controller generates addresses for storing and retrieving pixel data.

31. The checkerboard buffer of claim 3, where addresses of memory locations are generated using one or more counters.

32. The checkerboard buffer of claim 31, where the data source generates addresses for storing pixel data.

33. The checkerboard buffer of claim 31, where the data destination generates addresses for retrieving pixel data.

34. The checkerboard buffer of claim 31, where the counters include a row counter and a column counter.

35. The checkerboard buffer of claim 34, where the row counter and the column counter indicate an address stored in a look-up table.

36. The checkerboard buffer of claim 32, where addresses are mathematically derived from the values of the row counter and the column counter.

37. The checkerboard buffer of claim 31, where one counter counts pixel pairs.

38. The checkerboard buffer of claim 3, where pixel data is retrieved at twice or more than the rate pixel data is stored.

39. The checkerboard buffer of claim 38, where pixel data is stored at a rate supporting 60 frames per second, and pixel data is retrieved at a rate supporting 120 frames per second.

40. The checkerboard buffer of claim 38, where pixel data is retrieved for 64 pixels for every 32 pixels of pixel data that is stored.

41. The checkerboard buffer of claim 2, where the data destination is a grating light valve system including one or more grating light valves.

42. The checkerboard buffer of claim 41, where the frame is a high definition screen resolution frame having 1920 columns of pixels and 1080 rows of pixels per frame.

43. The checkerboard buffer of claim 41, where the grating light valve system includes three grating light valves, one for each of red, blue, and green.

44. The checkerboard buffer of claim 41, where each grating light valve sweeps one column at a time from left to right and from right to left in alternation.

45. The checkerboard buffer of claim 44, where a counter is used to generate addresses, and further where the counter increments as each grating light valve sweeps from left to right and the counter decrements as each grating light valve sweeps from right to left.

46. The checkerboard buffer of claim 2, where the data destination is a video card.

47. The checkerboard buffer of claim 1, where each memory device is an eight megabyte device.

48. The checkerboard buffer of claim 47, where each memory device is an SDRAM.

49. The checkerboard buffer of claim 47, where each memory device operates at approximately 150 MHZ.

50. The checkerboard buffer of claim 1, further comprising a memory controller that generates addresses for storing and retrieving pixel data.

51. The checkerboard buffer of claim 1, further comprising a memory controller that includes the first data switch and the second data switch, and controls providing pixel data to the memory devices and receiving pixel data from the memory devices.

52. The checkerboard buffer of claim 1, where each memory device is divided into two memory sections, a first memory section for storing data and a second memory section for retrieving data.

53. The checkerboard buffer of claim 52, where a block of data is stored to the first memory sections of the memory devices and a block of data is retrieved from the second memory sections in alternation, and the memory sections switch roles between storing and retrieving.

54. The checkerboard buffer of claim 53, where a block of data is pixel data for a block of 32 pixels.

55. The checkerboard buffer of claim 52, where a counter is used for addressing, and where the counter is alternately reset to the beginning of the first sections or to the beginning of the second sections.

56. The checkerboard buffer of claim 1, wherein the first switch swaps which data of the pairs is stored in which of the memory devices such that a first data of the pairs is stored in the memory device which previously stored a second data of the pairs and the second data of the pairs is stored in the memory device which previously stored the first data of the pairs.

57. A checkerboard buffer, comprising:
- a data source, providing data in pairs in a first order;
- a data destination, receiving data in a second order;
- at least two memory devices, each memory device having a plurality of memory locations, where data is stored in parallel to the memory devices and retrieved in parallel from the memory devices, and where data is stored according to the first order using sequential memory locations in the memory devices;
- a first data switch connected to the data source and each of the memory devices, where the first data switch controls which data of the pairs is stored to which memory device, wherein the first data switch is configured to swap which data of the pairs is stored in which of the memory devices; and
- a second data switch connected to the data destination and each of the memory devices, where the second data switch controls providing data to the data destination according to the second order.

58. The checkerboard buffer of claim 57, where:
- the checkerboard buffer is a frame buffer for storing a frame of pixels, the frame having horizontal rows of pixels and vertical columns of pixels;
- the pixels are numbered from left to right, top to bottom, starting from 0 in the upper left corner;
- the rows are numbered from top to bottom, starting from 0 at the top;
- the columns are numbered from left to right, starting from 0 at the left;
- the data is pixel data;
- each pixel in the frame has corresponding pixel data;
- pixel data for each pixel is stored in a respective memory location in a memory device; and
- pixel data stored in parallel is stored at the same address in each memory device.

59. The checkerboard buffer of claim 58, where the pixel data is provided according to a high definition screen resolution of 1920 columns of pixels and 1080 rows of pixels per frame, and where pixel data for respective halves of each row of pixels is stored in 960 memory locations in each of two memory devices.

60. The checkerboard buffer of claim 58, where each memory device has a number of memory locations allocated for pixel data for half of each row of pixels, and the number of memory locations allocated is half of the number of pixels in one row in the frame.

61. The checkerboard buffer of claim 60, where the number of memory locations allocated is 960.

62. The checkerboard buffer of claim 61, where the first data switch swaps the order pixel data from each of two memory devices is provided based on a counter reaching a multiple of 960.

63. The checkerboard buffer of claim 58, where a counter is used to generate addresses and the counter increments by 1 for each pair of pixels stored.

64. The checkerboard buffer of claim 58, where the same address is provided to each of two memory devices for storing pixel data.

65. A checkerboard buffer, comprising:
- a data source, providing data in pairs in a first order;
- a data destination, receiving data in a second order;
- at least four memory devices, each memory device having a plurality of memory locations, where data is stored in parallel to at least two memory devices and retrieved in parallel from at least two memory devices;
- a first data switch coupled to the data source and each of the memory devices, where the first data switch controls which data of the pairs is stored to which memory device, wherein the first data switch is configured to swap which data of the pairs is stored in which of the memory devices; and
- a second data switch connected to the data destination and each of the memory devices, where the second data switch controls providing data to the data destination according to the second order.

66. The checkerboard buffer of claim 65, where:
- the checkerboard buffer is a frame buffer for storing a frame of pixels, the frame having horizontal rows of pixels and vertical columns of pixels;
- the pixels are numbered from left to right, top to bottom, starting from 0 in the upper left corner;
- the rows are numbered from top to bottom, starting from 0 at the top;

the columns are numbered from left to right, starting from 0 at the left;

the data is pixel data;

each pixel in the frame has corresponding pixel data;

pixel data for each pixel is stored in a respective memory location in a memory device; and pixel data stored in parallel is stored at the same address in each memory device.

67. The checkerboard buffer of claim 66, where the pixel data is provided according to a high definition screen resolution of 1920 columns of pixels and 1080 rows of pixels per frame, and 1024 memory locations are allocated in each memory device for each row of pixels in a frame, and each half of the pixel data for a row is stored in a respective memory device.

68. The checkerboard buffer of claim 66, where pixel data for two pixels is stored in parallel in one clock cycle, pixel data for one pixel to one memory device and pixel data for the other pixel to another memory device.

69. The checkerboard buffer of claim 66, where pixel data for two pixels is retrieved in parallel in one clock cycle, pixel data for one pixel from one memory device and pixel data for the other pixel from another memory device.

70. The checkerboard buffer of claim 66, where, in one clock cycle, pixel data for two pixels is retrieved from two memory devices and pixel data for two pixels is stored in two memory devices.

71. The checkerboard buffer of claim 70, where four memory devices are divided into a first group of two memory devices and a second group of two memory devices, and the groups alternate between storing and retrieving pixel data after storing pixel data for a frame of pixels.

72. The checkerboard buffer of claim 65, where each memory device is an eight megabyte device.

73. The checkerboard buffer of claim 72, where each memory device is an SDRAM.

74. The checkerboard buffer of claim 72, where each memory device operates at approximately 150 MHZ.

75. The checkerboard buffer of claim 65, further comprising a memory controller that generates addresses for storing and retrieving pixel data.

76. The checkerboard buffer of claim 65, further comprising a memory controller that includes the first data switch and the second data switch, and controls providing pixel data to the memory devices and receiving pixel data from the memory devices.

77. The checkerboard buffer of claim 65, further comprising a four-by-four switch, where four memory devices are divided into a first group and a second group, each group including two memory devices, and further where the four-by-four switch provides data in alternation to the first group and the second group while retrieving data in alternation from the second group and the first group.

78. The checkerboard buffer of claim 65, where two of the memory devices are used for storing data and two of the memory devices are used for retrieving data, and the memory devices switch roles between storing and retrieving.

79. The checkerboard buffer of claim 78, where the memory devices switch roles based on a vertical synchronization signal.

80. The checkerboard buffer of claim 65, where data is retrieved at twice or more than the rate data is stored.

81. The checkerboard buffer of claim 80, where the data is pixel data, and pixel data is stored at a rate supporting 60 frames per second, and pixel data is retrieved at a rate supporting 120 frames per second.

82. The checkerboard buffer of claim 81, where pixel data is retrieved for 64 pixels for every 32 pixels of pixel data that is stored.

* * * * *